(12) United States Patent
Ostrowicki et al.

(10) Patent No.: US 12,512,434 B2
(45) Date of Patent: Dec. 30, 2025

(54) SEMICONDUCTOR PACKAGE FOR STRESS ISOLATION

(71) Applicant: TEXAS INSTRUMENTS INCORPORATED, Dallas, TX (US)

(72) Inventors: Gregory Ostrowicki, Dallas, TX (US); Amit Nangia, Murphy, TX (US); Kashyap Mohan, Irving, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 429 days.

(21) Appl. No.: 18/090,922

(22) Filed: Dec. 29, 2022

(65) Prior Publication Data

US 2024/0222310 A1   Jul. 4, 2024

(51) Int. Cl.
*H01L 23/00* (2006.01)
*H01L 21/56* (2006.01)
*H01L 23/31* (2006.01)

(52) U.S. Cl.
CPC ............ *H01L 24/32* (2013.01); *H01L 21/565* (2013.01); *H01L 23/3121* (2013.01); *H01L 23/3135* (2013.01); *H01L 24/16* (2013.01); *H01L 24/73* (2013.01); *H01L 2224/10125* (2013.01); *H01L 2224/10155* (2013.01); *H01L 2224/16227* (2013.01); *H01L 2224/17134* (2013.01); *H01L 2224/26175* (2013.01); *H01L 2224/73253* (2013.01); *H01L 2924/351* (2013.01)

(58) Field of Classification Search
CPC ............ H01L 23/3121; H01L 23/3135; H01L 2924/351; H01L 21/565; H01L 24/32; H01L 24/16; H01L 24/73; H01L 2224/10125; H01L 2224/10155; H01L 2224/16227; H01L 2224/17134; H01L 2224/26175; H01L 2224/73253
See application file for complete search history.

(56) References Cited

U.S. PATENT DOCUMENTS

2019/0181120 A1 * 6/2019 Chiang ............ H01L 23/49811

* cited by examiner

*Primary Examiner* — Peniel M Gumedzoe
(74) *Attorney, Agent, or Firm* — Dawn Jos; Frank D. Cimino

(57) ABSTRACT

In examples, a semiconductor package comprises a substrate having multiple conductive layers coupled to bond pads at a surface of the substrate. The package includes a semiconductor die including a device side facing the substrate, the device side having first and second circuitry regions, the first circuitry region having greater sensitivity to at least one of mechanical or thermal stress than the second circuitry region. The package also includes conductive members coupled to the bond pads of the substrate, in direct physical contact with the second circuitry region, and not in direct physical contact with the first circuitry region. The package further comprises a first support member coupled to the device side of the semiconductor die and extending toward the substrate and not touching the substrate or a second support member coupled to the substrate. The package also includes a ring on the substrate and encircling the bond pads and a glob top member covering the semiconductor die and a portion of the substrate circumscribed by the ring. The package also includes a mold compound covering the glob top member and the substrate.

20 Claims, 26 Drawing Sheets

SEMICONDUCTOR PACKAGE FOR STRESS ISOLATION

BACKGROUND

Precision circuits (e.g., reference voltage supplies) have exacting specifications that require the circuits to operate within a narrow range of parameters. A precision circuit may be covered by a package in an attempt to protect the circuit from influences, such as thermal fluctuations and mechanical stress, that can cause the circuit to fall outside the narrow range of parameters.

SUMMARY

In examples, a semiconductor package comprises a substrate having multiple conductive layers coupled to bond pads at a surface of the substrate. The package includes a semiconductor die including a device side facing the substrate, the device side having first and second circuitry regions, the first circuitry region having greater sensitivity to at least one of mechanical or thermal stress than the second circuitry region. The package also includes conductive members coupled to the bond pads of the substrate, in direct physical contact with the second circuitry region, and not in direct physical contact with the first circuitry region. The package further comprises a first support member coupled to the device side of the semiconductor die and extending toward the substrate and not touching the substrate or a second support member coupled to the substrate. The package also includes a ring on the substrate and encircling the bond pads and a glob top member covering the semiconductor die and a portion of the substrate circumscribed by the ring. The package also includes a mold compound covering the glob top member and the substrate.

In examples, a method for manufacturing a semiconductor package comprises forming a substrate including a first conductive layer; a second conductive layer positioned below the first conductive layer; a via coupled between the first and second conductive layers; a dielectric covering the first and second conductive layers and the via; and a first support member at a top surface of the substrate. The method also comprises coupling conductive members on a device side of a semiconductor die to bond pads on the substrate, the device side of the semiconductor die including first and second circuitry regions, the first circuitry region having greater sensitivity to at least one of mechanical or thermal stress than the second circuitry region, the conductive members in direct physical contact with the second circuitry region and not in direct physical contact with the first circuitry region, a second support member on the device side vertically aligned with the first support member. The method further comprises underfilling a volume between the substrate and the device side with a first glob top member and covering the semiconductor die and the substrate with a second glob top member, the substrate including a ring to restrict flow of the second glob top member. The method also comprises covering the second glob top member and the substrate with a mold compound.

DETAILED DESCRIPTION

Figure 1A:
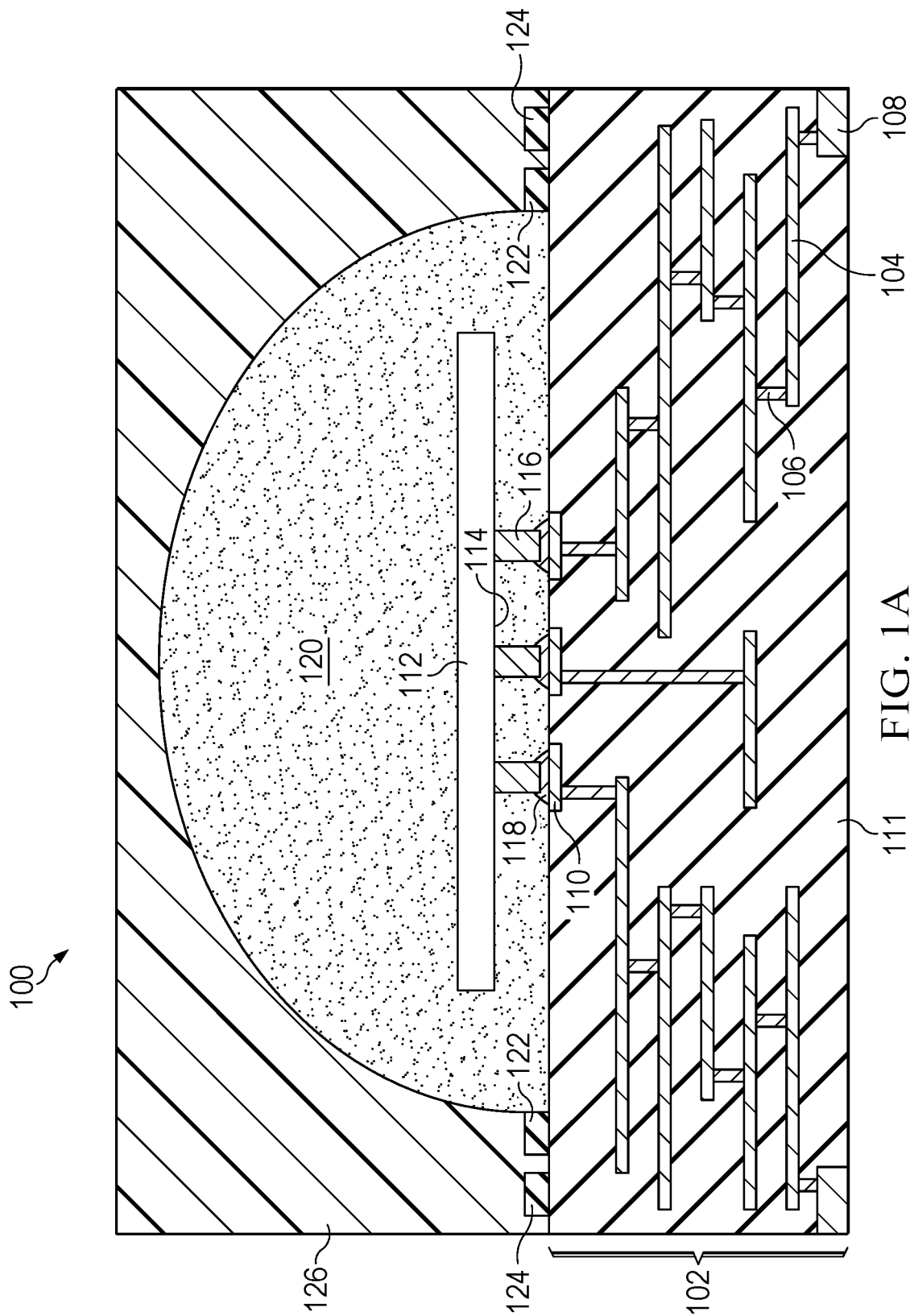
FIG. 1A is a cross-sectional profile view of a semiconductor package configured to isolate precision circuitry from mechanical and thermal stress, in accordance with various examples.

As described above, a precision circuit may be covered by a package in an attempt to protect the circuit from deleterious influences, such as thermal fluctuations and mechanical stress, that can cause the circuit to fail to meet specifications. For example, a reference voltage supply that is to provide a precise reference voltage may be susceptible to thermal fluctuations or mechanical stress that is applied to the reference voltage supply or to the package that contains the reference voltage supply. Because the reference voltage supply in this scenario is a precision circuit, even small voltage swings may be unacceptable. Prior approaches to solving this challenge include metal can packages and thermal islands on printed circuit boards (PCBs) to mitigate the influence of thermal fluctuations and mechanical stress on the semiconductor die in which the precision circuit is formed, but such approaches have proven inadequate. Thermal fluctuations and mechanical stress remain a challenge for precision circuitry. Moreover, many precision circuits are particularly sensitive to systematic stresses and experience significant parametric shifts after solder reflow, temperature cycling, and assembly processes. Current strategies to mitigate random stress from mold compound filler particles are ineffective at mitigating systematic stress.

This disclosure describes various examples of a semiconductor package that mitigates the challenges described above. In some examples, such a semiconductor package includes a substrate having multiple conductive layers coupled to bond pads at a surface of the substrate. The package also may include a semiconductor die including a device side facing the substrate, the device side having first and second circuitry regions, and the first circuitry region having greater sensitivity to mechanical and/or thermal stress than the second circuitry region. The package also comprises conductive members coupled to the bond pads of the substrate, in direct physical contact with the second circuitry region, and not in direct physical contact with the first circuitry region. The package may include a first support member coupled to the device side of the semiconductor die and extending toward the substrate and not touching the substrate or a second support member coupled to the substrate. The package may include a ring on the substrate and encircling the bond pads. The package may include a glob top member covering the semiconductor die and a portion of the substrate circumscribed by the ring. The package may include a mold compound covering the glob top member and the substrate. Such a package mitigates systematic mechanical and/or thermal stress on precision circuitry by positioning the circuitry far away from conductive members that couple to the substrate, and by covering the semiconductor die in a gelatinous, low-modulus glob top member.

The semiconductor package described herein provides various technical advantages. By positioning the precision circuitry far from the conductive members, mechanical and thermal energy introduced to the semiconductor die by the conductive members has a lesser impact on the precision circuitry, thus enhancing precision circuitry performance. Such relative positioning of precision and non-precision circuitry also significantly increases the space available for precision circuitry on the die, because the non-precision circuitry is clustered near or at the conductive members. Further, the glob top member shields the precision circuitry from mechanical and thermal energy introduced to the package via the mold compound, thus enhancing precision circuitry performance. The semiconductor packages described herein also eliminates the manufacturing and reliability risks associated with glob top member and wirebond approaches, where the glob top member must enclose bond wires entirely. In addition to these technical advantages, the semiconductor packages described herein represent a significantly lower cost alternative to large, expensive ceramic cavity packages.

FIG. 1A is a cross-sectional profile view of a semiconductor package 100 configured to isolate precision circuitry from mechanical and thermal stress, in accordance with various examples. The semiconductor package 100 may include a substrate 102. In examples, the substrate 102 includes multiple conductive (e.g., copper) layers 104. Although seven layers 104 are shown, any suitable number (e.g., 2-4 layers) may be included. The conductive layers 104 extend in a horizontal direction, approximately parallel with the length of the substrate 102. Vias 106 extend vertically and couple each of the conductive layers 104 to one or more other conductive layers 104, thereby forming a network of conductive layers in the substrate 102 configured to carry electrical signals, power, etc. Not all of the conductive layers 104 are necessarily depicted in FIG. 1A, because FIG. 1A is a cross-sectional view and does not visualize all aspects of the substrate 102.

The substrate 102 may include conductive terminals 108 and 110. The conductive terminals 108 may be metal components that are exposed to one or more external surfaces of the substrate 102. In examples, the conductive terminals 108 are similar to the pins of a quad flat no lead (QFN) type package. The conductive terminals 108 may be suitable for coupling the substrate 102 to a printed circuit board (PCB). The conductive terminals 110 are exposed to a top surface of the substrate 102 and are suitable for coupling to metal components external to the substrate 102, such as solder bumps. In examples, the substrate 102 includes a dielectric material 111 (e.g., AJINOMOTO® build-up film (ABF)) that covers the various conductive layers 104, vias 106, and conductive terminals 108 and 110. The substrate 102 may include other components besides those expressly described here.

The package 100 further includes a semiconductor die 112. The semiconductor die 112 may include silicon, gallium nitride, or any other suitable semiconductor material. The semiconductor die 112 includes a device side 114 in and/or on which circuitry is formed. The device side 114 faces the substrate 102. The device side 114 includes, or has coupled thereto, conductive members 116. In examples, the conductive members 116 are copper posts or pillars. The conductive members 116 are coupled to different conductive terminals 110 by way of solder bumps 118. In this way, multiple conductive pathways are established between the circuitry of the semiconductor die 112 and the conductive terminals 108.

As described above, the device side 114 of the semiconductor die 112 includes circuitry. Some of this circuitry may be precision circuitry (e.g., reference voltage supplies, clocks, and other circuits that are relatively vulnerable to mechanical and thermal stress, or systemic stress). In contrast, some of the circuitry may be non-precision circuitry (e.g., circuitry that is minimally, or not at all, vulnerable to mechanical or thermal stress, or systemic stress). Mechanical and thermal stresses are most likely to be imparted to the circuitry on the device side 114 by way of the solder bumps 118 and the conductive members 116. Thus, in examples, the precision circuitry is positioned on the device side 114 relatively far (e.g., as far as possible) from the conductive members 116. Similarly, in examples, the non-precision circuitry is positioned on the device side 114 close to the conductive members 116, thus making more space available elsewhere on the device side 114 for the precision circuitry. For example, precision circuitry may be positioned along a perimeter of the device side 114, and non-precision circuitry may be positioned in the center of the device side 114, directly above or nearly directly above the conductive members 116.

Mechanical and thermal stresses also may be imparted to the circuitry of a semiconductor die by way of a mold compound that may cover the semiconductor die. Accordingly, the package 100 includes a glob top member 120 covering the semiconductor die 112 and extending horizontally in all directions beyond the semiconductor die 112, the conductive members 116, and the solder bumps 118. The glob top member 120 protects the semiconductor die 112, the conductive members 116, and the solder bumps 118 from mechanical and thermal stress. To adequately protect the semiconductor die 112 (e.g., the precision circuitry on the device side 114) from mechanical and thermal stress, the glob top member 120 may have a thickness ranging from 10 microns to 500 microns, meaning that the distance from any precision circuitry on the semiconductor die 112 and a closest point on the outer surface of the glob top member 120 falls within this range. A distance below this range is disadvantageous because it results in inadequate mechanical and thermal protection for the precision circuitry on the device side 114. A distance above this range is disadvantageous because it increases package size without any additional benefit to stress reduction. During application, the glob top member 120 flow is restricted by a ring 122, and any overflow of the glob top member 120 over the ring 122 is restricted by a ring 124. Additional concentric rings may be included. The rings 122, 124 may be composed of any suitable conductive or non-conductive material. The horizontal distance between rings 122, 124 ranges from 50 microns to 200 microns, with a lesser distance being disadvantageous because of manufacturing limitations for fine features, and with a greater distance being disadvantageous because of the concomitant increase in package size without any benefit to stress reduction. A mold compound 126 covers the substrate 102, the glob top member 120 and the rings 122, 124.

Figure 1B:
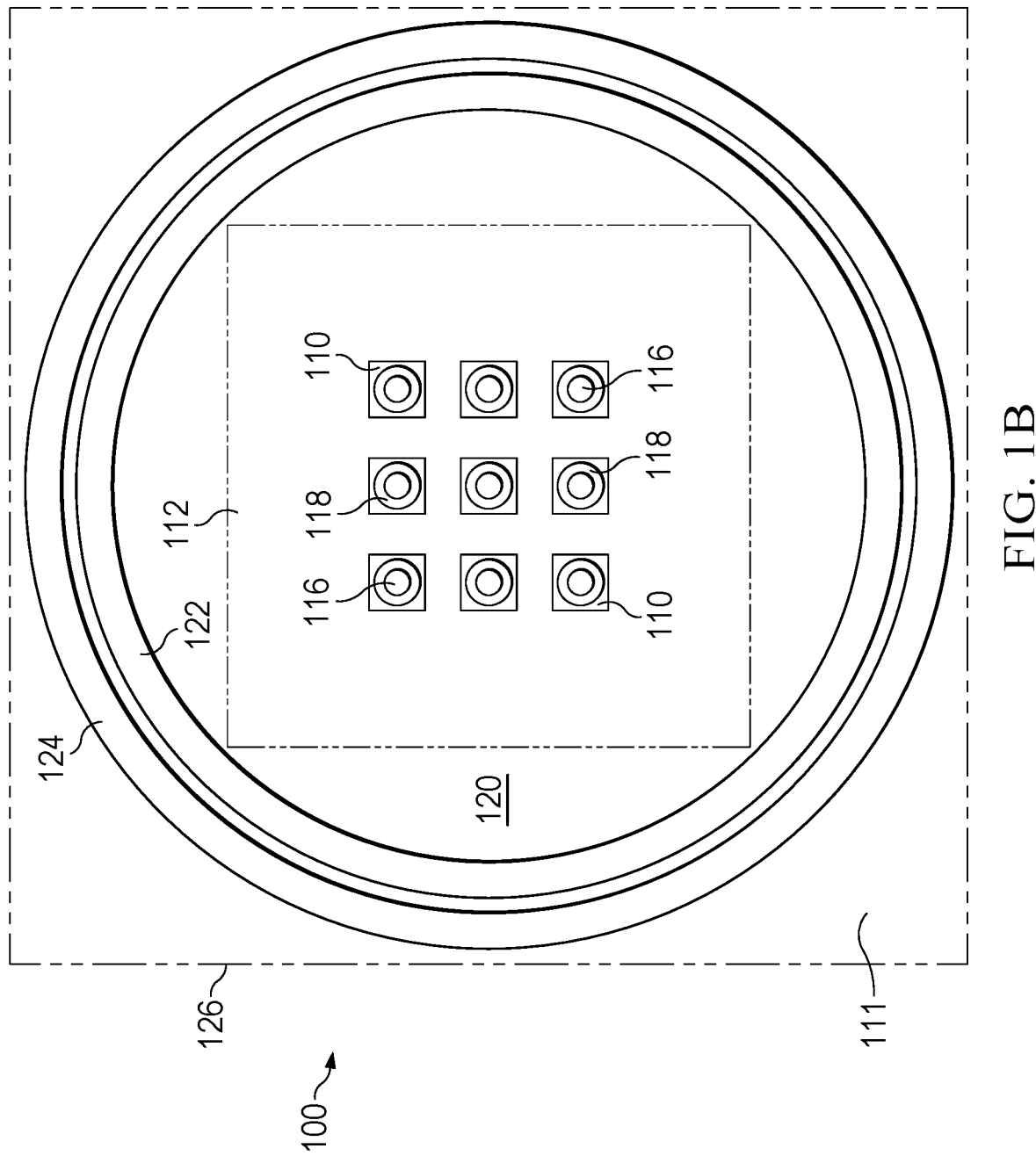
FIG. 1B is a top-down view of a semiconductor package configured to isolate precision circuitry from mechanical and thermal stress, in accordance with various examples.
Figure 1C:
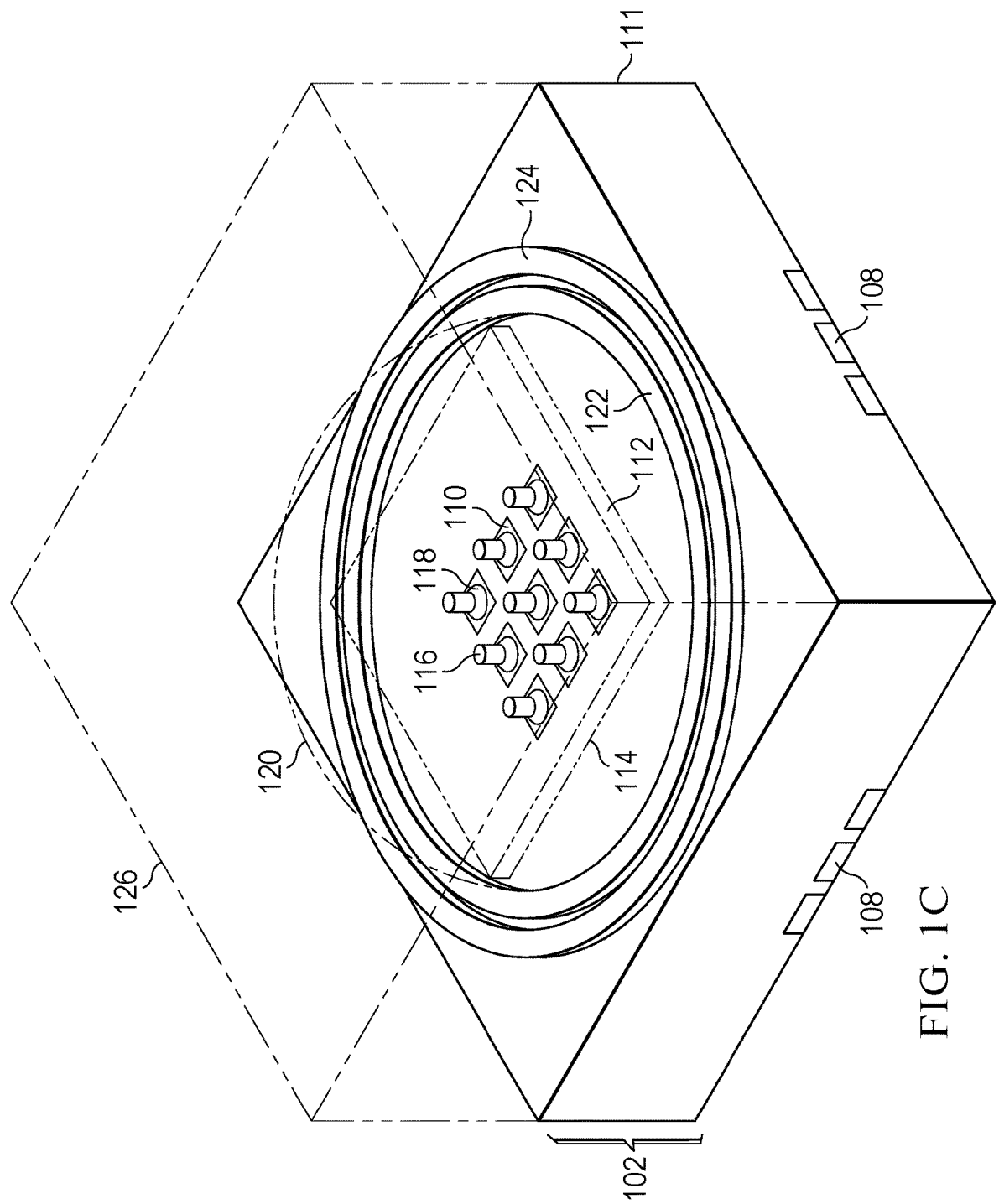
FIG. 1C is a perspective view of a semiconductor package configured to isolate precision circuitry from mechanical and thermal stress, in accordance with various examples.
Figure 1D:
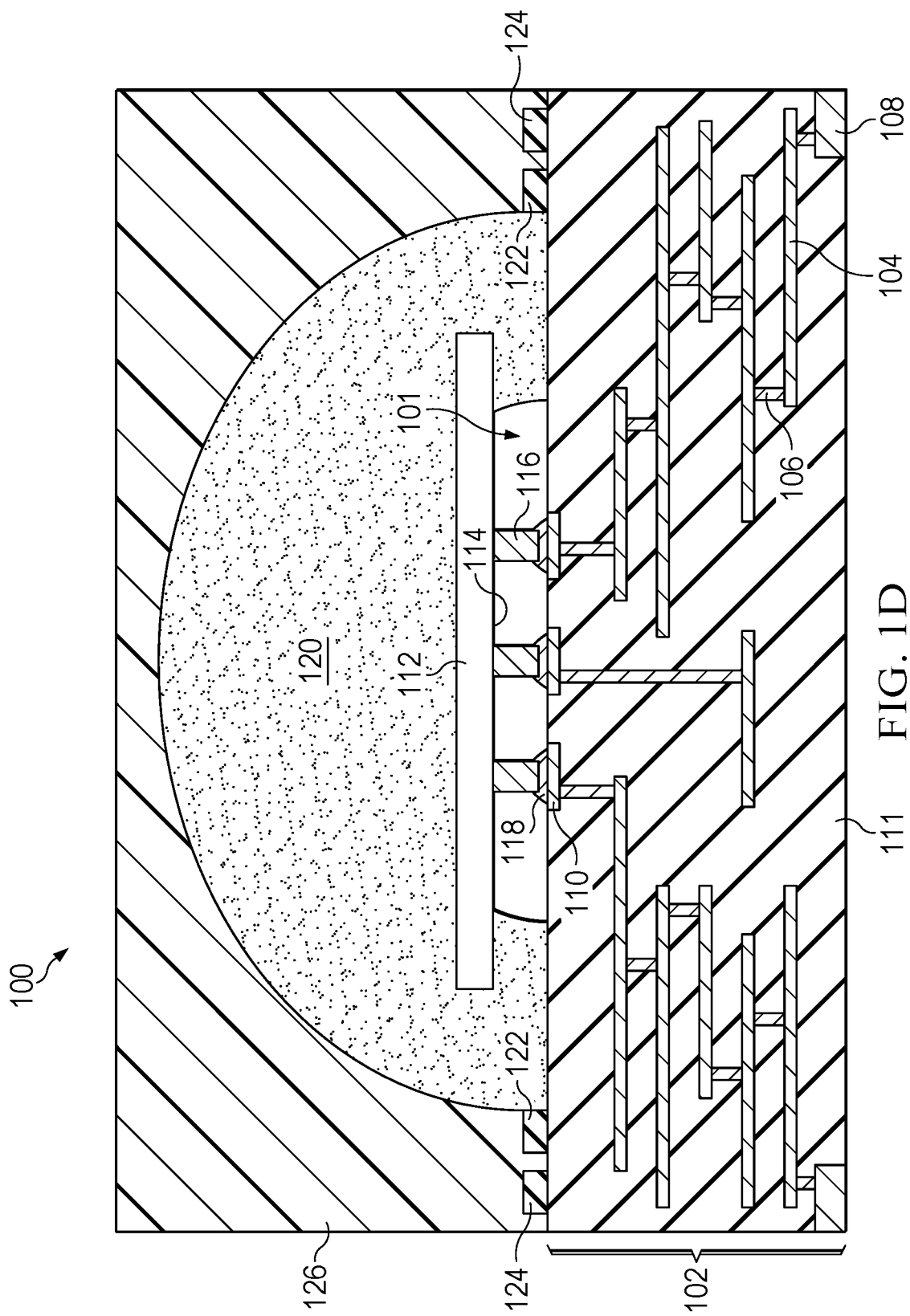
FIG. 1D is a cross-sectional profile view of a semiconductor package configured to isolate precision circuitry from mechanical and thermal stress, in accordance with various examples.

FIG. 1B is a top-down view of the semiconductor package 100, in accordance with various examples. FIG. 1C is a perspective view of the semiconductor package 100, in accordance with various examples. FIG. 1D is identical to FIG. 1A, but it shows the possible formation of an air gap 101 below the semiconductor die 112 due to dispensing of the glob on top of the semiconductor die 112 without the use of underfill below the die 112, if the glob does not flow under the die 112.

Figure 2A:
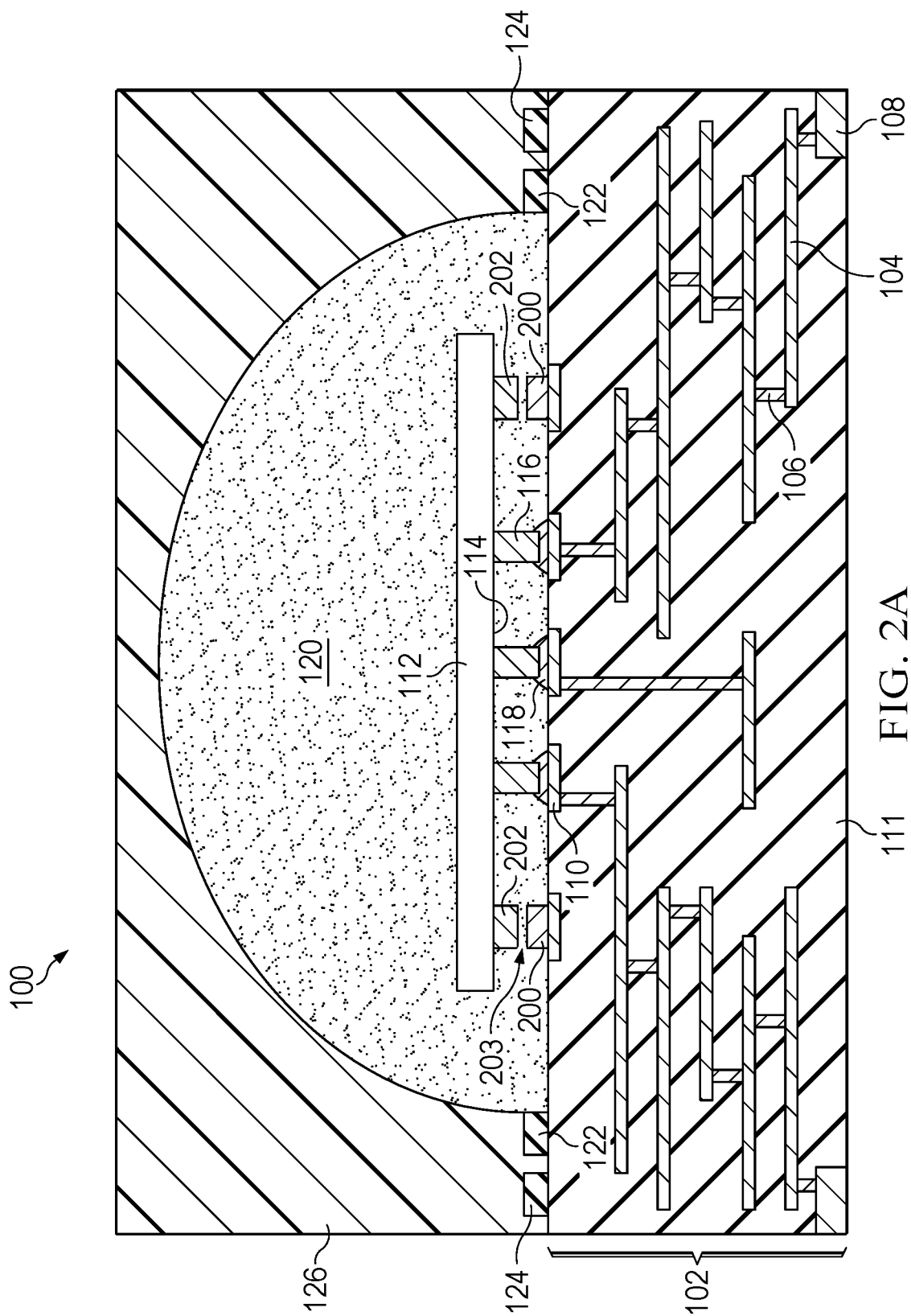
FIG. 2A is a cross-sectional profile view of a semiconductor package configured to isolate precision circuitry from mechanical and thermal stress and to mitigate die tipping, in accordance with various examples.

In FIGS. 1A-1C, the conductive members 116 are concentrated in a relatively small area, as opposed to being distributed over a larger area of the device side 114. As explained, by concentrating the conductive members 116 in a relatively small area (e.g., at or near the center of the device side 114), precision circuitry can be located relatively far from the conductive members 116, and non-precision circuitry can be located relatively close to the conductive members 116. A possible consequence of such configurations, however, is that the semiconductor die 112 is susceptible to die tipping (e.g., the die 112 tipping over due to a lack of distributed support over a broad area of the device side 114, with the conductive members 116 individually or collectively operating as a fulcrum), particularly during the manufacturing process. To mitigate the consequences of such potential die tipping, some examples of the package 100 may include support members that will maintain the position of the semiconductor die 112 even in the event of die tipping. FIG. 2A is a cross-sectional profile view of the semiconductor package 100 configured to isolate precision circuitry from mechanical and thermal stress and to mitigate die tipping, in accordance with various examples. As FIG. 2A shows, the example package 100 is identical to the example package 100 of FIGS. 1A-1C, but with the addition of support members 200 and 202. The support members 200 may be formed in or on a surface of the substrate 102 that abuts the glob top member 120. In examples, the support members 200 are conductive, and in other examples, the support members 200 are non-conductive. For instance, the support members 200 may be metal members, such as copper studs that are plated during manufacture of the substrate 102. In examples, the support members 200 may be ABF. In examples, the support members 202 may be formed in or on the device side 114. In examples, the support members 202 are conductive, and in other examples, the support members 202 are non-conductive (e.g., composed of polyimide). In examples, a conductive support member 200 or 202 is not paired with a corresponding conductive support member 202 or 200, so as to avoid forming an electrical pathway through a pair of conductive support members 200, 202. In examples, the support members 202 may be metal members, such as plated copper studs. In examples, the support members 202 may be a polyimide or other non-conductive material.

In examples, the support members 200 have thicknesses ranging between 10 microns and 100 microns. Greater thicknesses are disadvantageous because they require increased chip standoff and conductive member 116 thickness, and lesser thicknesses are disadvantageous because they are inadequate relative to the conductive member 116 thicknesses to prevent die tilting. In examples, the support members 202 have thicknesses ranging between 10 microns and 100 microns. Greater thicknesses are disadvantageous because they require increased chip standoff and greater conductive member 116 thickness, and lesser thicknesses are disadvantageous because they are inadequate relative to the conductive member 116 thicknesses to prevent die tilting. In examples, a gap 203 may exist between each pair of corresponding support members 200, 202, to avoid transferring mechanical or thermal stress toward precision circuitry on the device side 114. The gap 203 has a distance ranging from 0 microns to 50 microns, with a wider gap being disadvantageous because it prevents the support members 200, 202 from mitigating die tilt because the degree of die tilt that would occur before the support members 200, 202 contact each other would result in significant structural damage. If the semiconductor die 112 were to tip to one side or the other, a pair of vertically aligned support members 200, 202 may contact each other, thus stopping the die tipping motion and maintaining the position of the semiconductor die 112, or at least preventing an excessive degree of die tipping. In examples, the support member 202 is in direct physical contact with the precision circuitry on the device side 114. In some examples, the support member 200 is omitted and the support member 202 extends from the device side 114 toward and almost touching the top surface of the substrate 102, with a gap between the support member 202 and the top surface of the substrate 102 ranging between 0 microns and 50 microns. In other examples, the support member 202 is omitted and the support member 200 extends from the top surface of the substrate 102 toward and almost touching the device side 114, with a gap between the support member 200 and the device side 114 ranging between 0 microns and 50 microns.

Figure 2B:
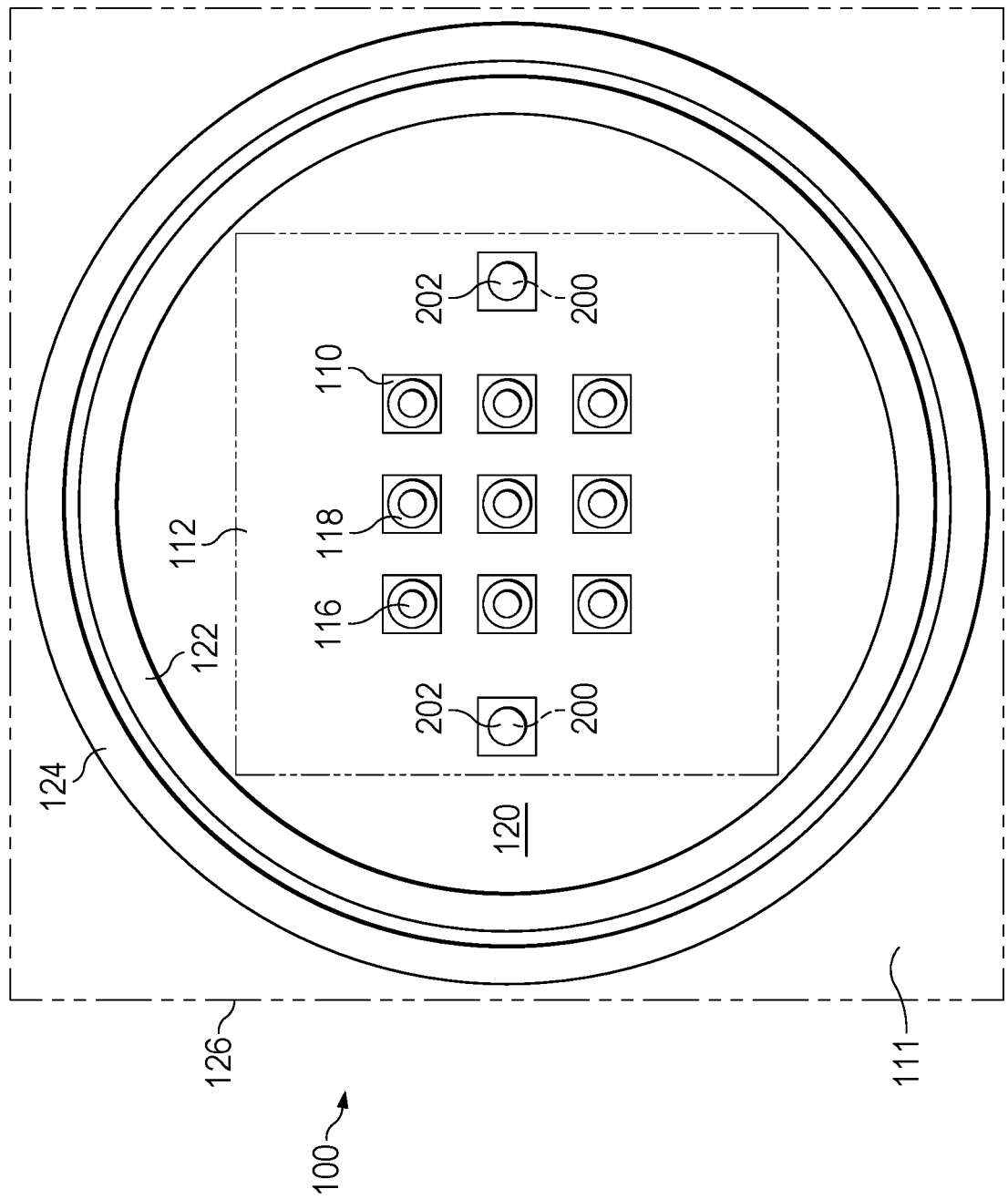
FIG. 2B is a top-down view of a semiconductor package configured to isolate precision circuitry from mechanical and thermal stress and to mitigate die tipping, in accordance with various examples.
Figure 2C:
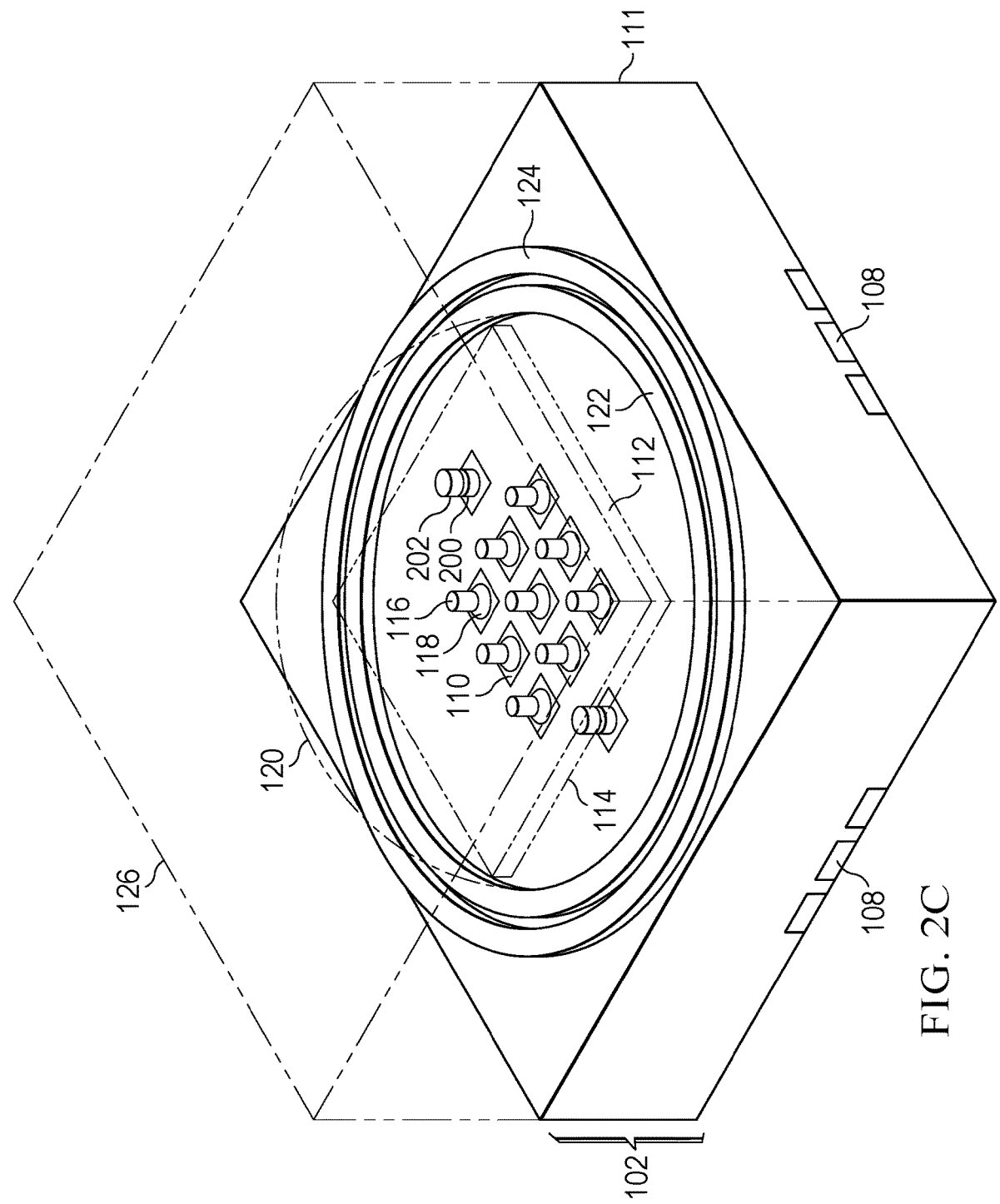
FIG. 2C is a perspective view of a semiconductor package configured to isolate precision circuitry from mechanical and thermal stress and to mitigate die tipping, in accordance with various examples.
Figure 2D:
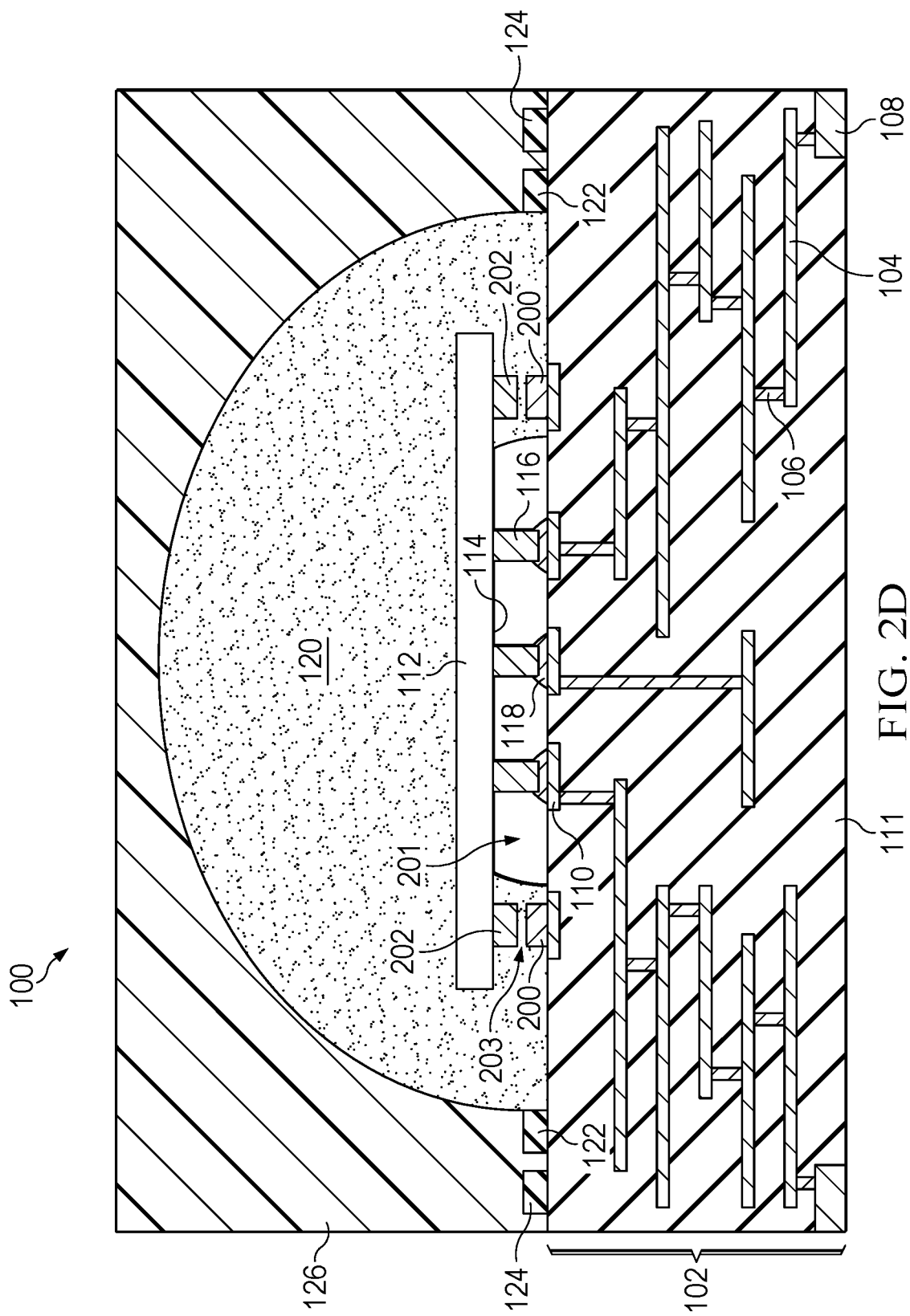
FIG. 2D is a cross-sectional profile view of a semiconductor package configured to isolate precision circuitry from mechanical and thermal stress and to mitigate die tipping, in accordance with various examples.

FIG. 2B is a top-down view of the example semiconductor package 100 of FIG. 2A. FIG. 2C is a perspective view of the example semiconductor package 100 of FIG. 2A. FIG. 2D is identical to FIG. 2A, but it shows the possible formation of an air gap 201 below the semiconductor die 112 due to dispensing of the glob on top of the semiconductor die 112 without the use of underfill below the die 112, if the glob does not flow under the die 112.

Figure 3A:
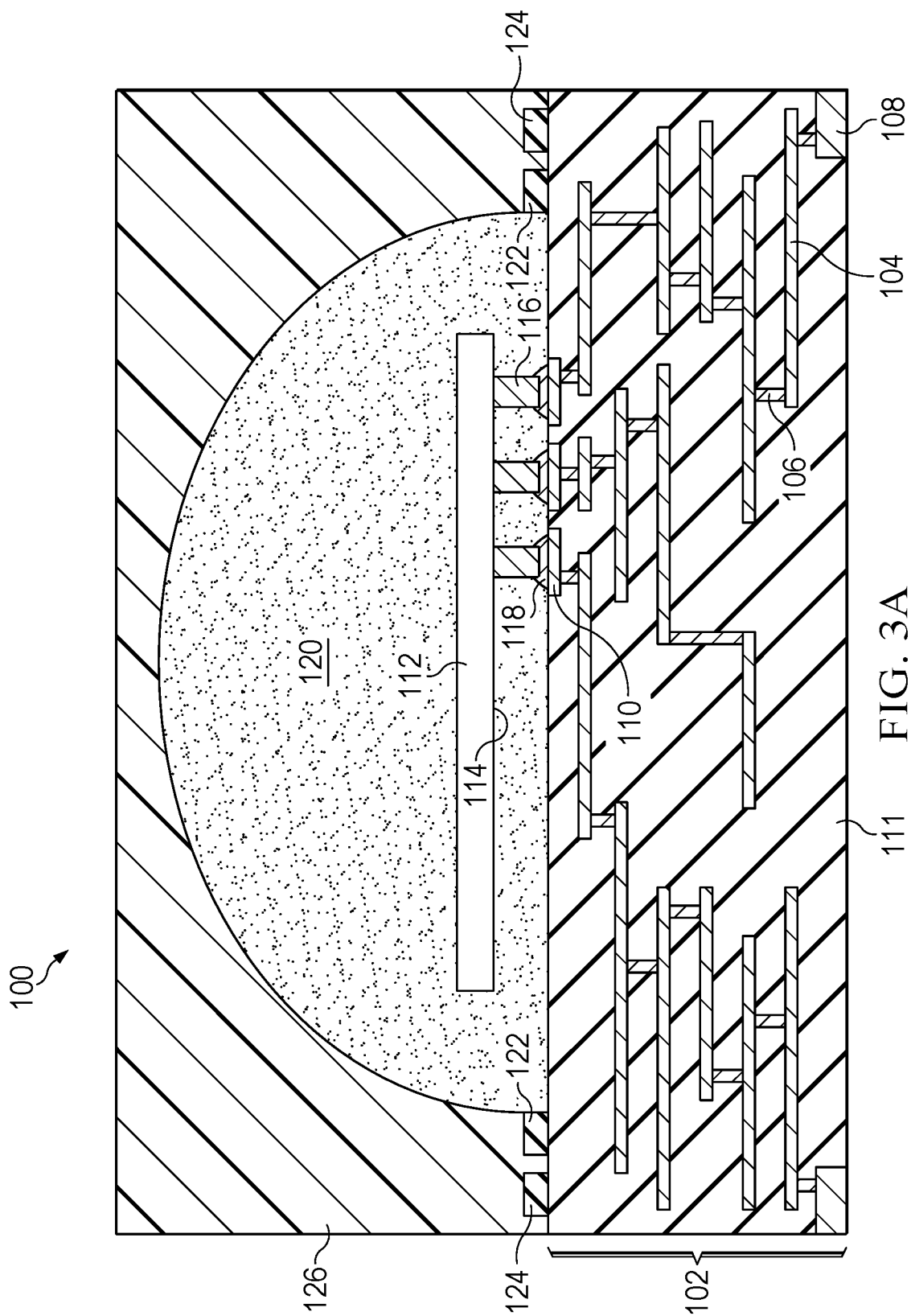
FIG. 3A is a cross-sectional profile view of a semiconductor package configured to isolate precision circuitry from mechanical and thermal stress, in accordance with various examples.
Figure 3B:
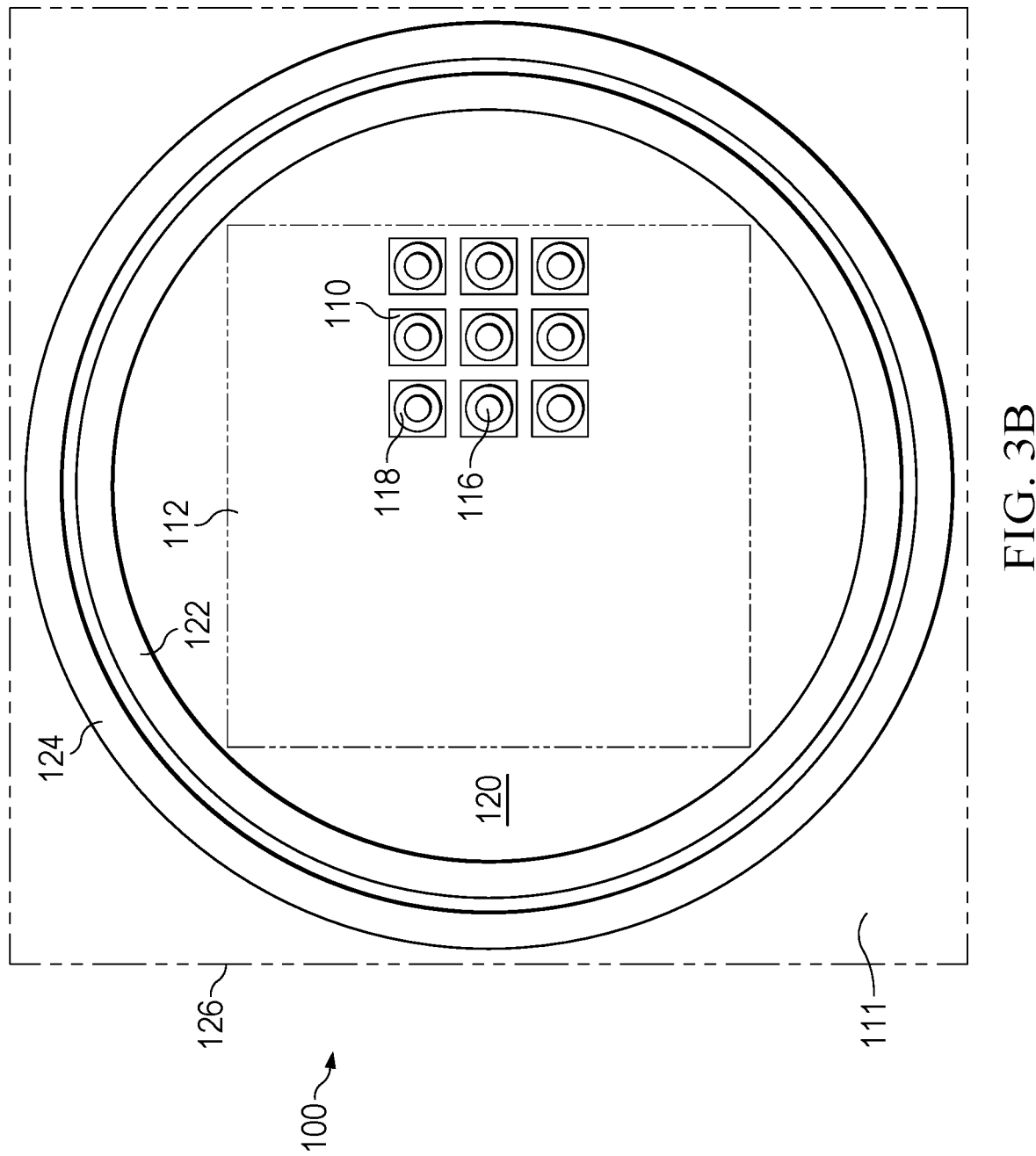
FIG. 3B is a top-down view of a semiconductor package configured to isolate precision circuitry from mechanical and thermal stress, in accordance with various examples.
Figure 3C:
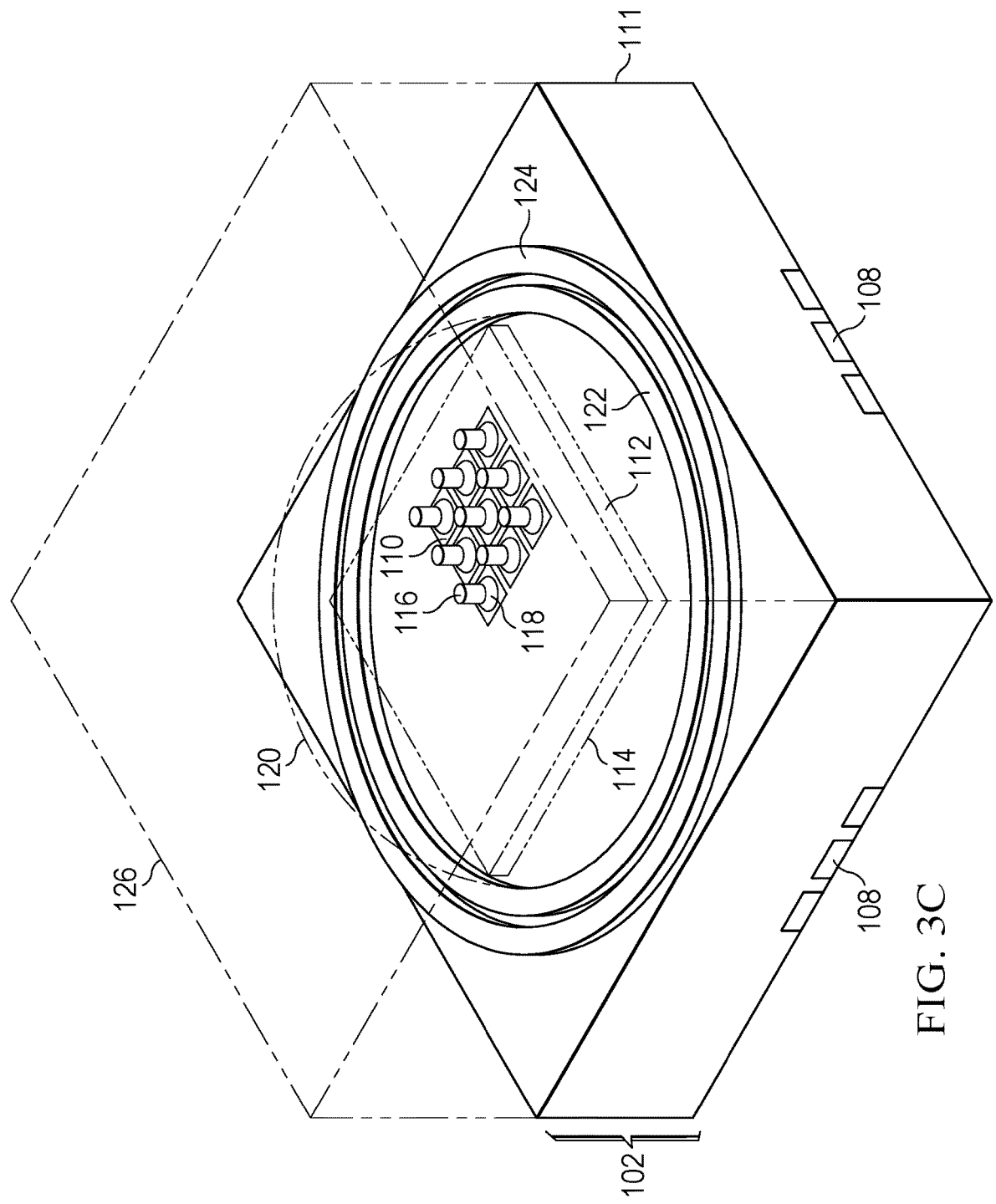
FIG. 3C is a perspective view of a semiconductor package configured to isolate precision circuitry from mechanical and thermal stress, in accordance with various examples.
Figure 3D:
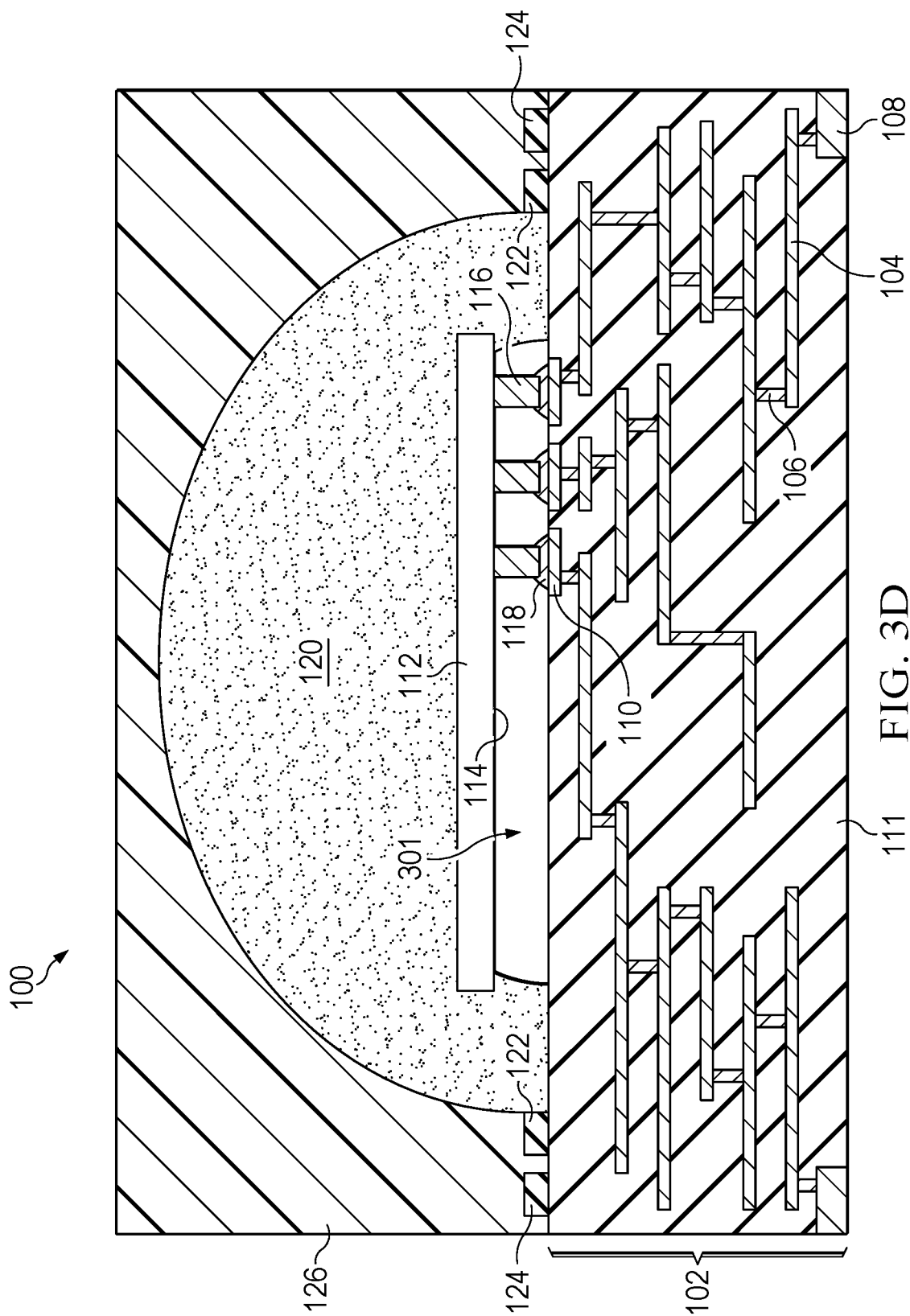
FIG. 3D is a cross-sectional profile view of a semiconductor package configured to isolate precision circuitry from mechanical and thermal stress, in accordance with various examples.

The group of conductive members 116 may be positioned anywhere on the device side 114. In FIGS. 1A-1C and 2A-2C, the conductive members 116 are located in a central area of the device side 114. The conductive members 116 may also be located at or near an end of the device side 114. FIG. 3A is a cross-sectional profile view of the semiconductor package 100, in accordance with various examples. The package 100 of FIG. 3A is identical to that of FIG. 1A, except that the conductive members 116 and their respective solder bumps 118 are located near an end of the device side 114. FIG. 3B is a top-down view of the example semiconductor package 100 of FIG. 3A. FIG. 3C is a perspective view of the example semiconductor package 100 of FIG. 3A. FIG. 3D is identical to FIG. 3A, but it shows the possible formation of an air gap 301 below the semiconductor die 112 due to dispensing of the glob on top of the semiconductor die 112 without the use of underfill below the die 112, if the glob does not flow under the die 112.

Figure 4A:
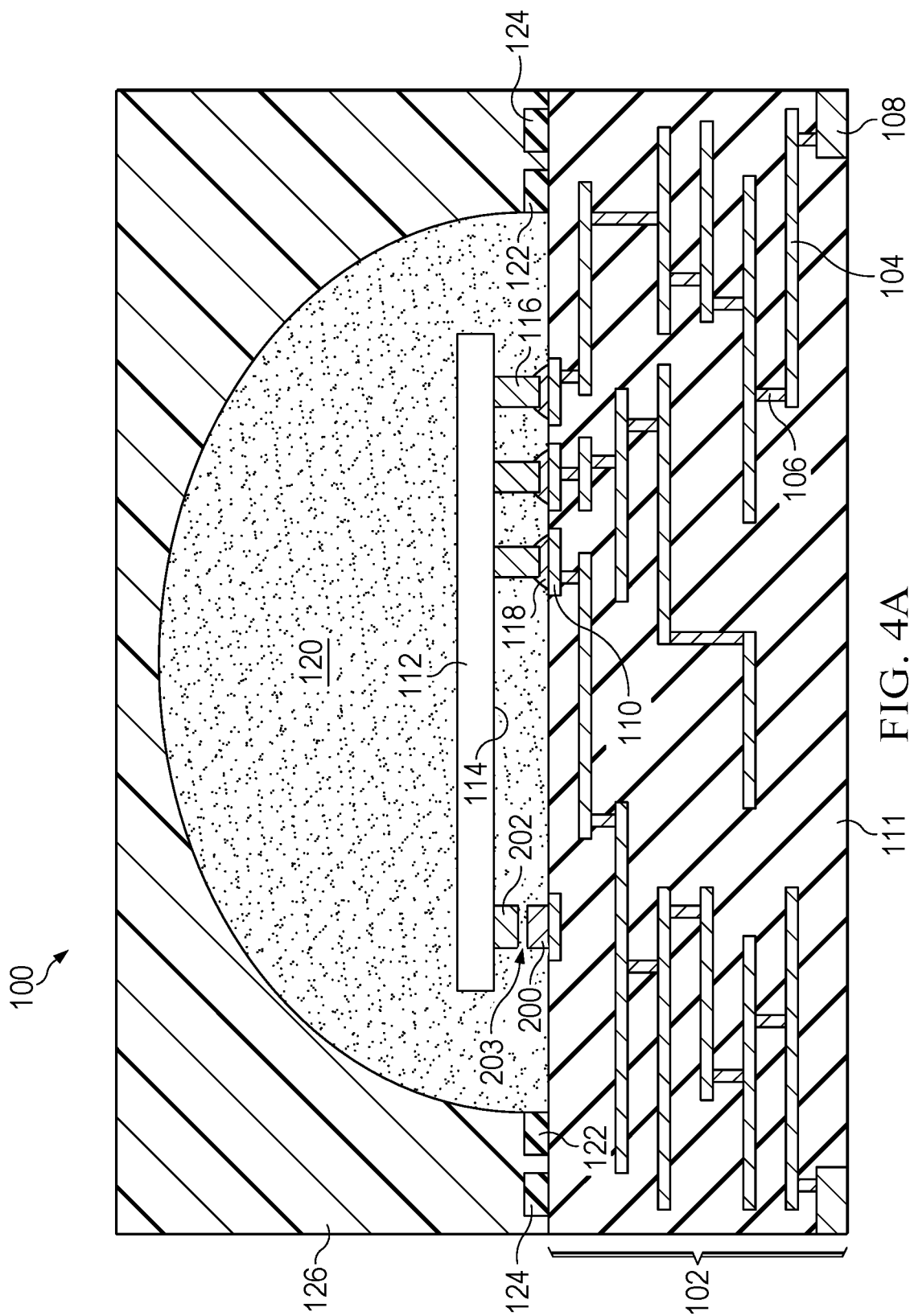
FIG. 4A is a cross-sectional profile view of a semiconductor package configured to isolate precision circuitry from mechanical and thermal stress and to mitigate die tipping, in accordance with various examples.
Figure 4B:
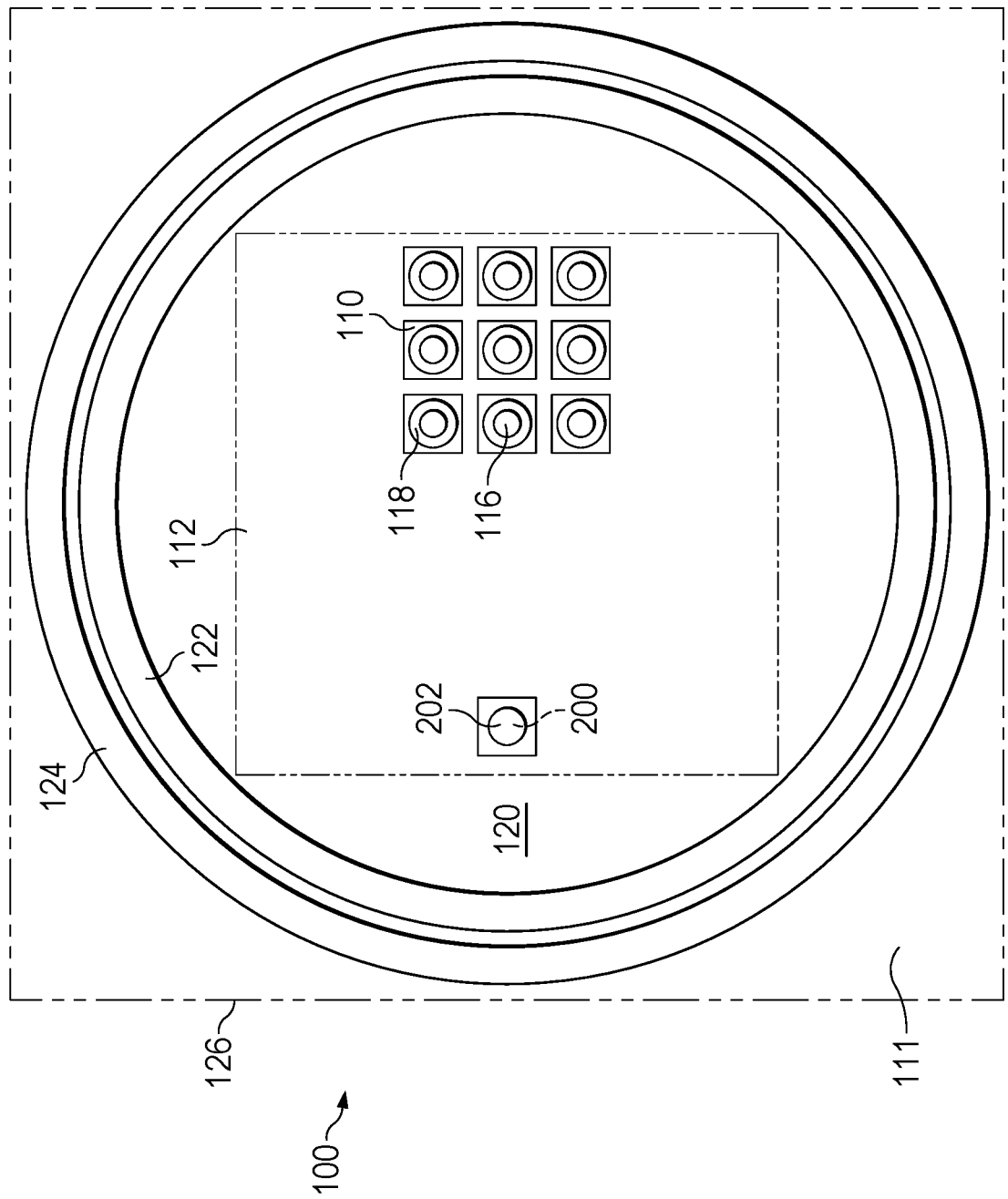
FIG. 4B is a top-down view of a semiconductor package configured to isolate precision circuitry from mechanical and thermal stress and to mitigate die tipping, in accordance with various examples.
Figure 4C:
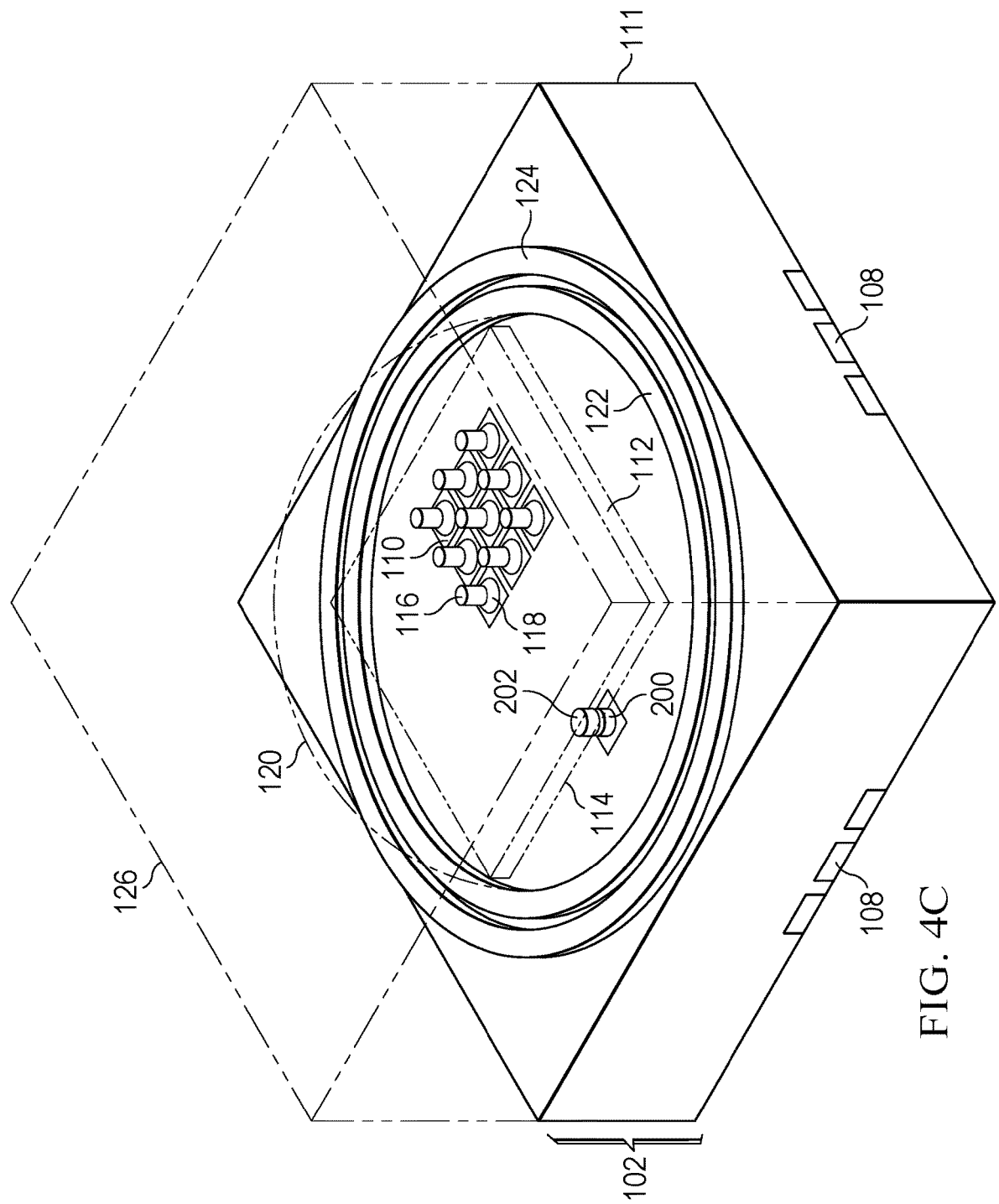
FIG. 4C is a perspective view of a semiconductor package configured to isolate precision circuitry from mechanical and thermal stress and to mitigate die tipping, in accordance with various examples.
Figure 4D:
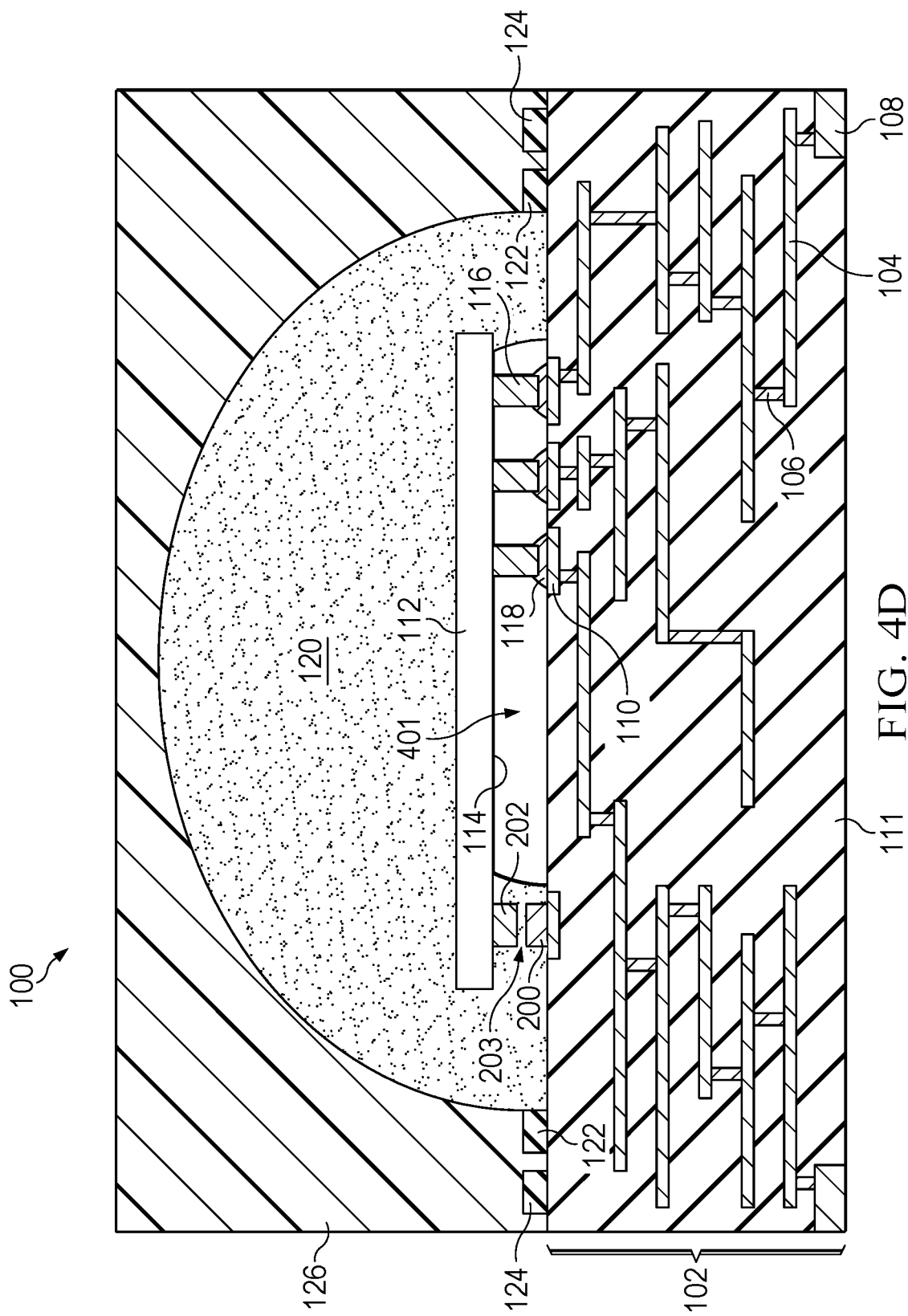
FIG. 4D is a cross-sectional profile view of a semiconductor package configured to isolate precision circuitry from mechanical and thermal stress and to mitigate die tipping, in accordance with various examples.

The example package 100 of FIGS. 3A-3C may be more vulnerable to die tipping than the example packages 100 of FIGS. 1A-1C and 2A-2C, because the conductive members 116 are located near an end, rather than a center, of the device side 114. Support members 200, 202 may be useful to mitigate the deleterious effects of such die tipping. FIG. 4A is a cross-sectional profile view of an example semiconductor package 100 configured to isolate precision circuitry from mechanical and thermal stress and to mitigate die tipping, in accordance with various examples. The package 100 includes support members 200, 202, the details of which are already described above and thus are not repeated here. FIG. 4B is a top-down view of the example semiconductor package 100 of FIG. 4A. FIG. 4C is a perspective view of the example semiconductor package 100 of FIG. 4A. FIG. 4D is identical to FIG. 4A, but it shows the possible formation of an air gap 401 below the semiconductor die 112 due to dispensing of the glob on top of the semiconductor die 112 without the use of underfill below the die 112, if the glob does not flow under the die 112.

Figure 5:
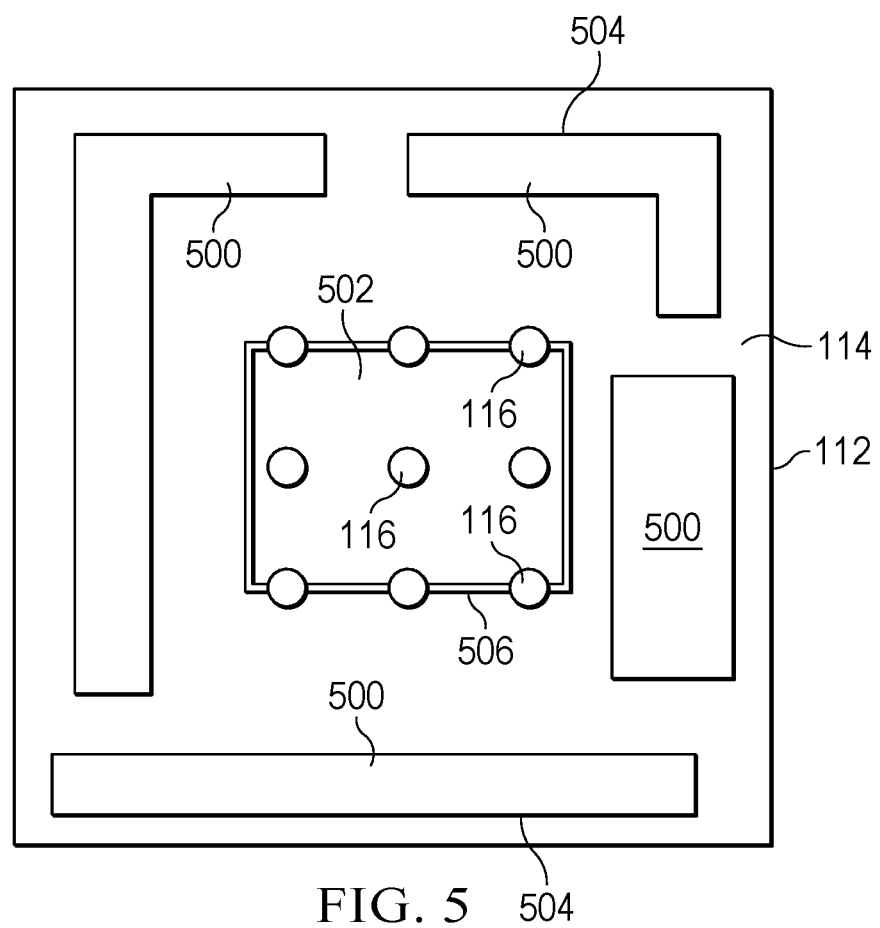
FIG. 5 is a bottom-up view of a semiconductor die including precision circuitry distanced from vertical conductive members, in accordance with various examples.

FIG. 5 is a bottom-up view of a semiconductor die 112 including precision circuitry distanced from vertical conductive members, in accordance with various examples. More particularly, the example semiconductor die 112 of FIG. 5 is representative of the die 112 in FIGS. 1A-1C and 2A-2C, where the conductive members 116 are located near a center of the die 112. The device side 114 includes precision circuitry 500 (e.g., reference voltage supplies, clocks) and non-precision circuitry 502. The precision circuitry 500 is positioned along a perimeter of the device side 114, away from the conductive members 116. Thus, the conductive members 116 are not in direct contact with the precision circuitry 500 region. The precision circuitry 500 is depicted as having bounds 504, but the scope of this disclosure is not limited as such. The non-precision circuitry 502 is located at or near a center of the device side 114, with the conductive members 116. Thus, the conductive members 116 are in direct contact with the non-precision circuitry 502 region. The non-precision circuitry 502 is depicted as having bounds 506, but the scope of this disclosure is not limited as such.

Figure 6:
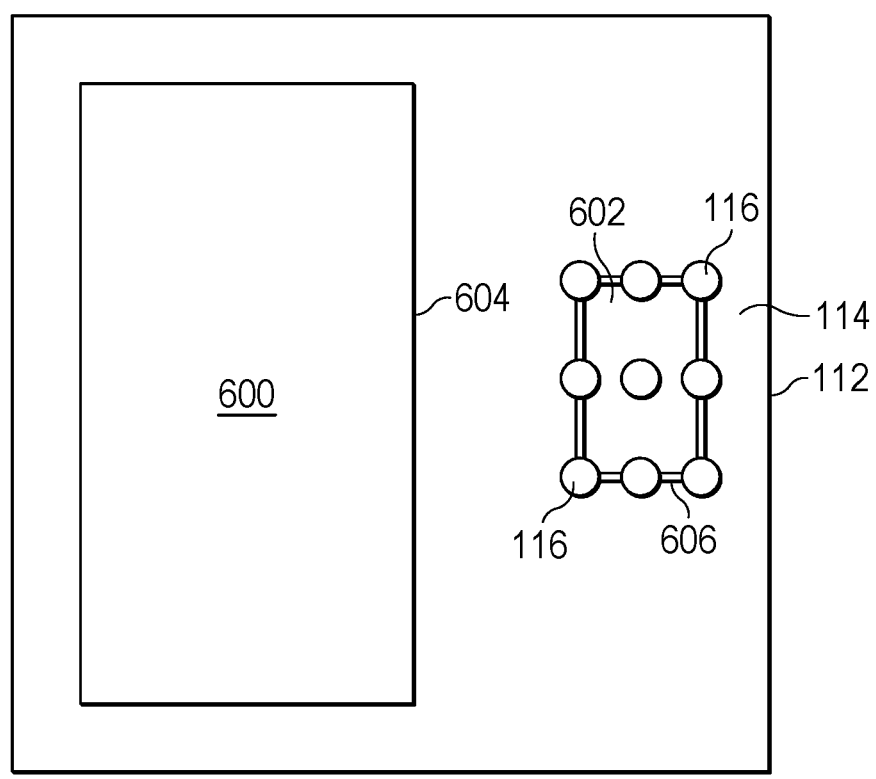
FIG. 6 is a bottom-up view of a semiconductor die including precision circuitry distanced from vertical conductive members, in accordance with various examples.

FIG. 6 is a bottom-up view of a semiconductor die 112 including precision circuitry distanced from vertical conductive members, in accordance with various examples. More particularly, the example semiconductor die 112 of FIG. 6 is representative of the die 1112 in FIGS. 3A-3C and 4A-4C, where the conductive members 116 are located near an edge of the die 112. The device side 114 includes precision circuitry 600 (e.g., reference voltage supplies, clocks) and non-precision circuitry 602. The precision circuitry 600 is positioned along an edge of the device side 114, away from the conductive members 116. The precision circuitry 600 is depicted as having bounds 604, although the scope of this disclosure is not limited as such. The non-precision circuitry 602 is located at or near the conductive members 116. The non-precision circuitry 602 is depicted as having bounds 606, but the scope of this disclosure is not limited as such.

Figure 7:
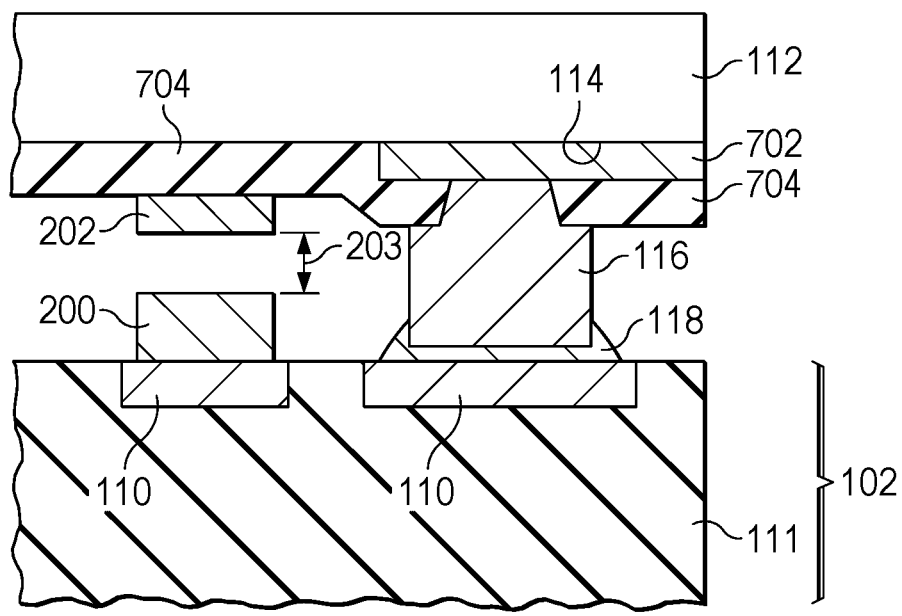
FIG. 7 is a close-up, cross-sectional, profile view of a semiconductor package configured to isolate precision circuitry from mechanical and thermal stress and to mitigate die tipping, in accordance with various examples.

FIG. 7 is a close-up, cross-sectional, profile view of an example semiconductor package 100. The semiconductor die 112 includes a metal layer 702 coupled to the conductive member 116 through an opening in a polyimide layer 704. The support member 200 is coupled to a conductive terminal 110, although the particular conductive terminal 110 to which the support member 200 is coupled may not couple to any other metal layers or vias in the substrate 102. Rather, the conductive terminal 110 to which the support member 200 is coupled may be useful for plating the support member 200. The support member 202 may comprise polyimide in some examples and may be coupled to the polyimide layer 704. Example thicknesses of the support members 200, 202 are provided above and are not repeated here. However, the support members 200, 202 may have minimal width and length requirements, or else a collision between the support members 200, 202 caused by die tipping may result in one or both of the support members 200, 202 becoming damaged or cracked. Accordingly, each of the support members 200, 202 has a width ranging from 10 microns to 500 microns, with a smaller width being disadvantageous because of manufacturing limitations for fine features, and with a greater width being disadvantageous because it increases the area of the substrate 102 to accommodate such large features. Each of the support members 200, 202 has a length ranging from 10 microns to 500 microns, with a smaller length being disadvantageous because of manufacturing limitations for fine features, and with a greater length being disadvantageous because it increases the area of the substrate 102 to accommodate such large features.

Figure 8:
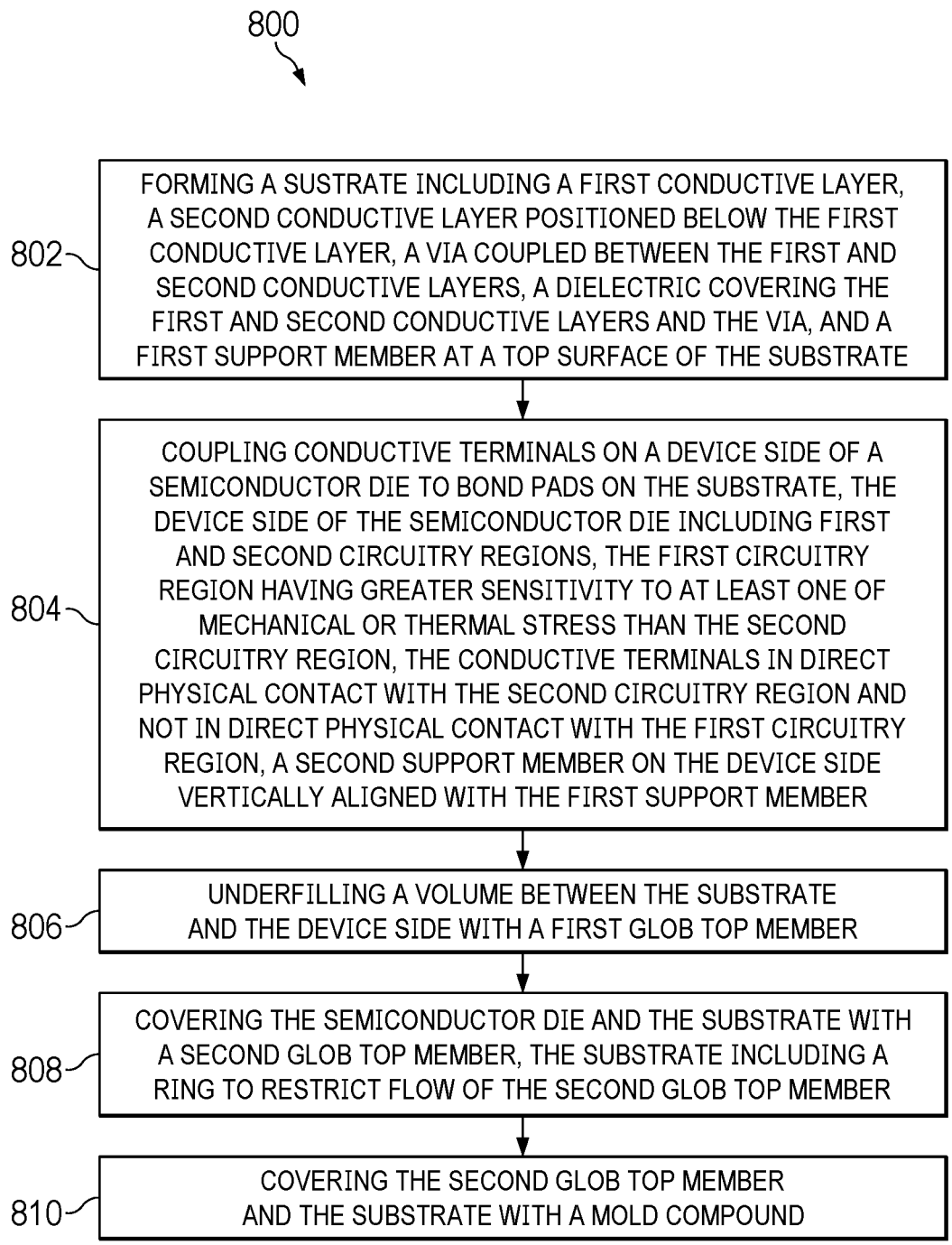
FIG. 8 is a flow diagram of a method for manufacturing a semiconductor package configured to isolate precision circuitry from mechanical and thermal stress and to mitigate die tipping, in accordance with various examples.

FIG. 8 is a flow diagram of a method 800 for manufacturing a semiconductor package configured to isolate precision circuitry from mechanical and thermal stress and to mitigate die tipping, in accordance with various examples. FIGS. 9A-9E are a process flow for manufacturing a semiconductor package configured to isolate precision circuitry from mechanical and thermal stress and to mitigate die tipping, in accordance with various examples. Accordingly, FIGS. 8 and 9A-9E are now described in parallel.

Figure 9A:
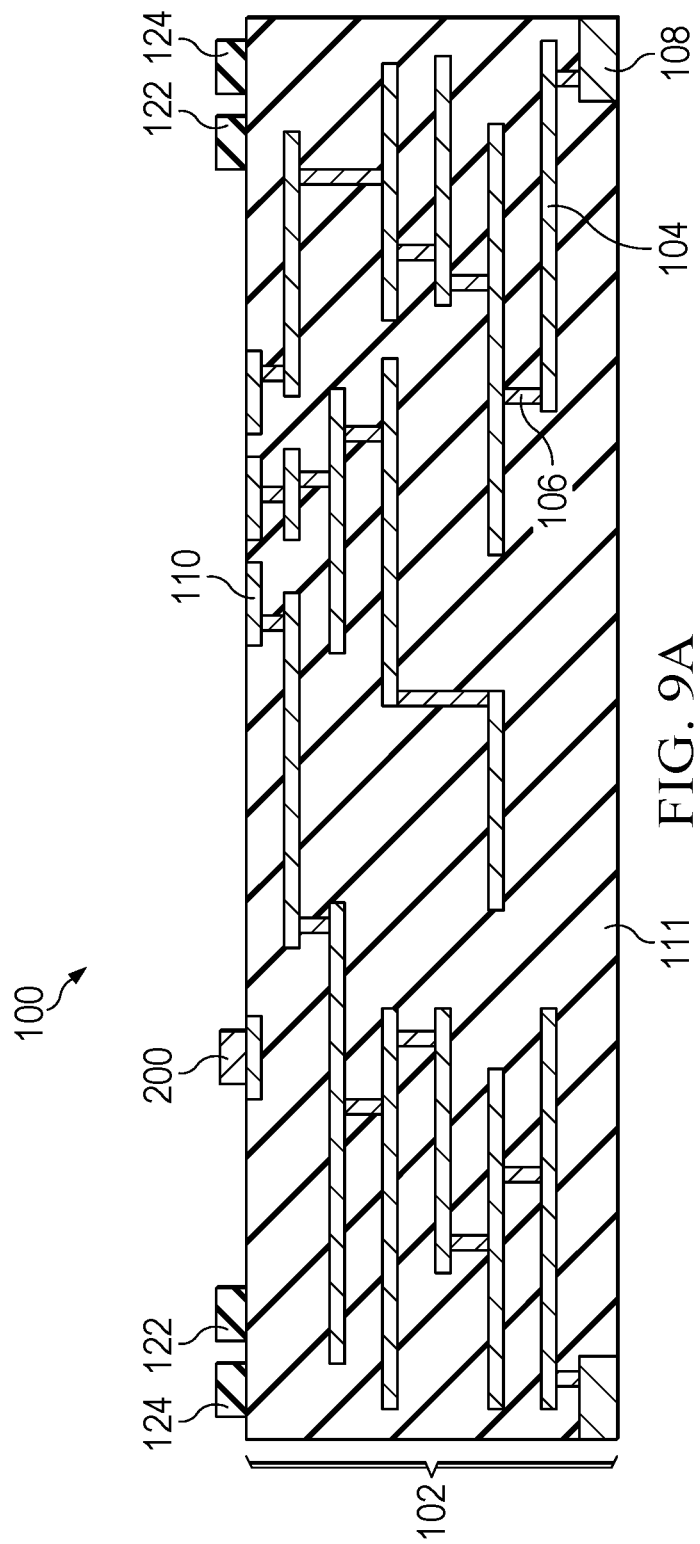
FIGS. 9A-9E are a process flow for manufacturing a semiconductor package configured to isolate precision circuitry from mechanical and thermal stress and to mitigate die tipping, in accordance with various examples.

The method 800 begins by forming a substrate including a first conductive layer; a second conductive layer positioned below the first conductive layer; a via coupled between the first and second conductive layers; a dielectric covering the first and second conductive layers and the via; and a first support member at a top surface of the substrate (802). FIG. 9A depicts the substrate 102, which includes first and second conductive layers 104, vias 106, a dielectric material 111 covering the first and second conductive layers 104 and the vias 106, and a first support member 200 at the top of the substrate 102.

Figure 9B:
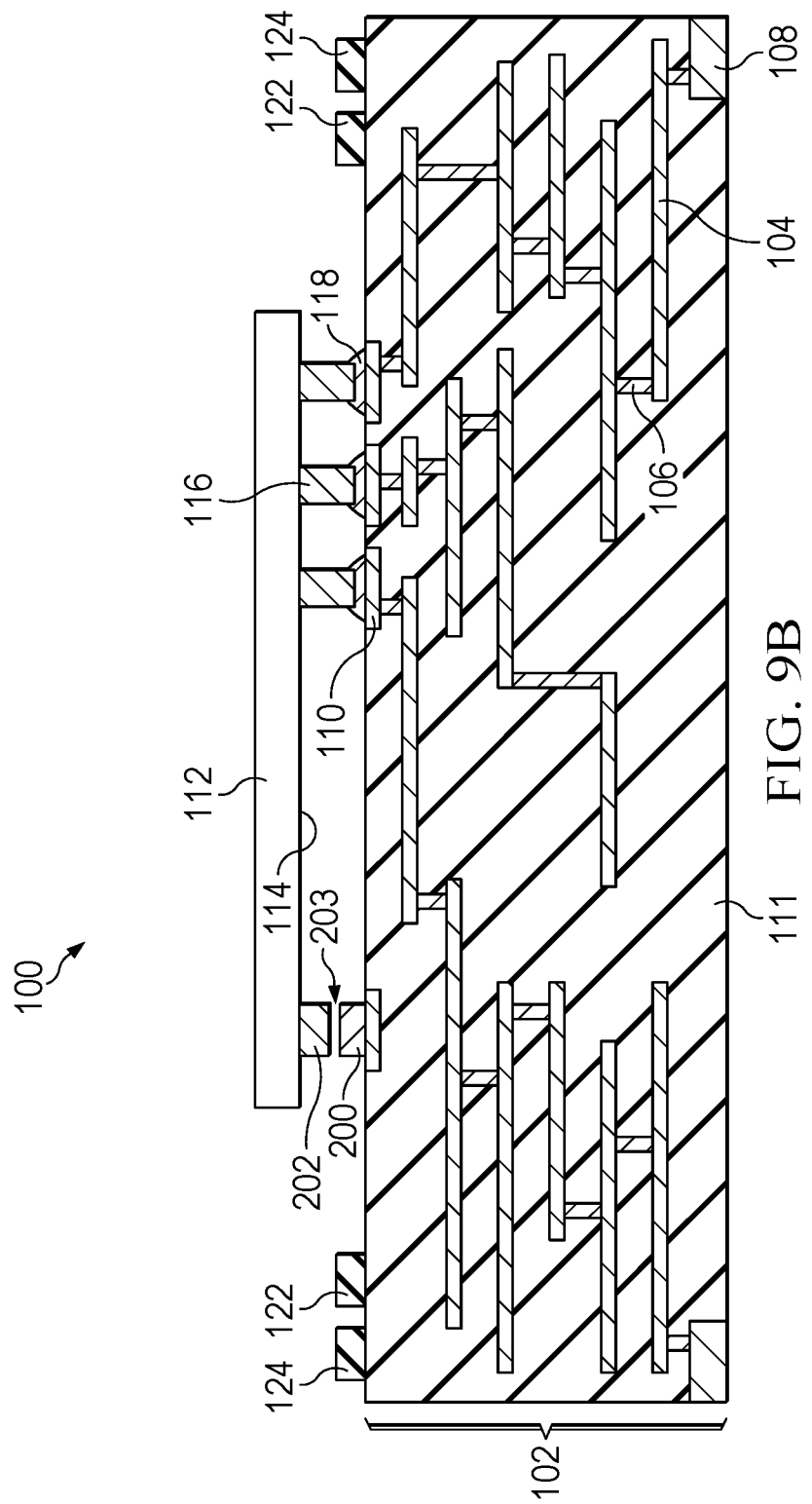

The method 800 includes coupling conductive members on a device side of a semiconductor die to bond pads on the substrate, where the device side of the semiconductor die includes first and second circuitry regions (804). The first circuitry region has greater sensitivity to at least one of mechanical or thermal stress than the second circuitry region (804). The conductive members are in direct physical contact with the second circuitry region and not in direct physical contact with the first circuitry region (804). A second support member on the device side is vertically aligned with the first support member (804). FIG. 9B shows the structure of FIG. 9A, except with the addition of the semiconductor die 112 coupled to the substrate 102 by way of conductive members 116 and solder bumps 118. The semiconductor die 112 also includes support member 202. The conductive members 116 on the device side 114 are coupled to conductive terminals 110 (which may be considered bond pads because they are at the surface of the substrate 102) on the substrate 102. The device side 114 includes first and second circuitry regions (e.g., precision circuitry and non-precision circuitry, examples of which are shown in FIGS. 5 and 6). The first circuitry region (e.g., the precision circuitry) has a greater sensitivity to at least one of mechanical or thermal stress, or systemic stress, than the second circuitry region (e.g., the non-precision circuitry). As shown in FIGS. 5 and 6, the conductive members 116 are in direct physical contact with the non-precision circuitry and are not in direct physical contact with the precision circuitry. The support members 200, 202 are vertically aligned, meaning that a vertical line perpendicular to the substrate 102 extends through both support members 200, 202, even if the support members 200, 202 are not in total vertical alignment.

Figure 9C:
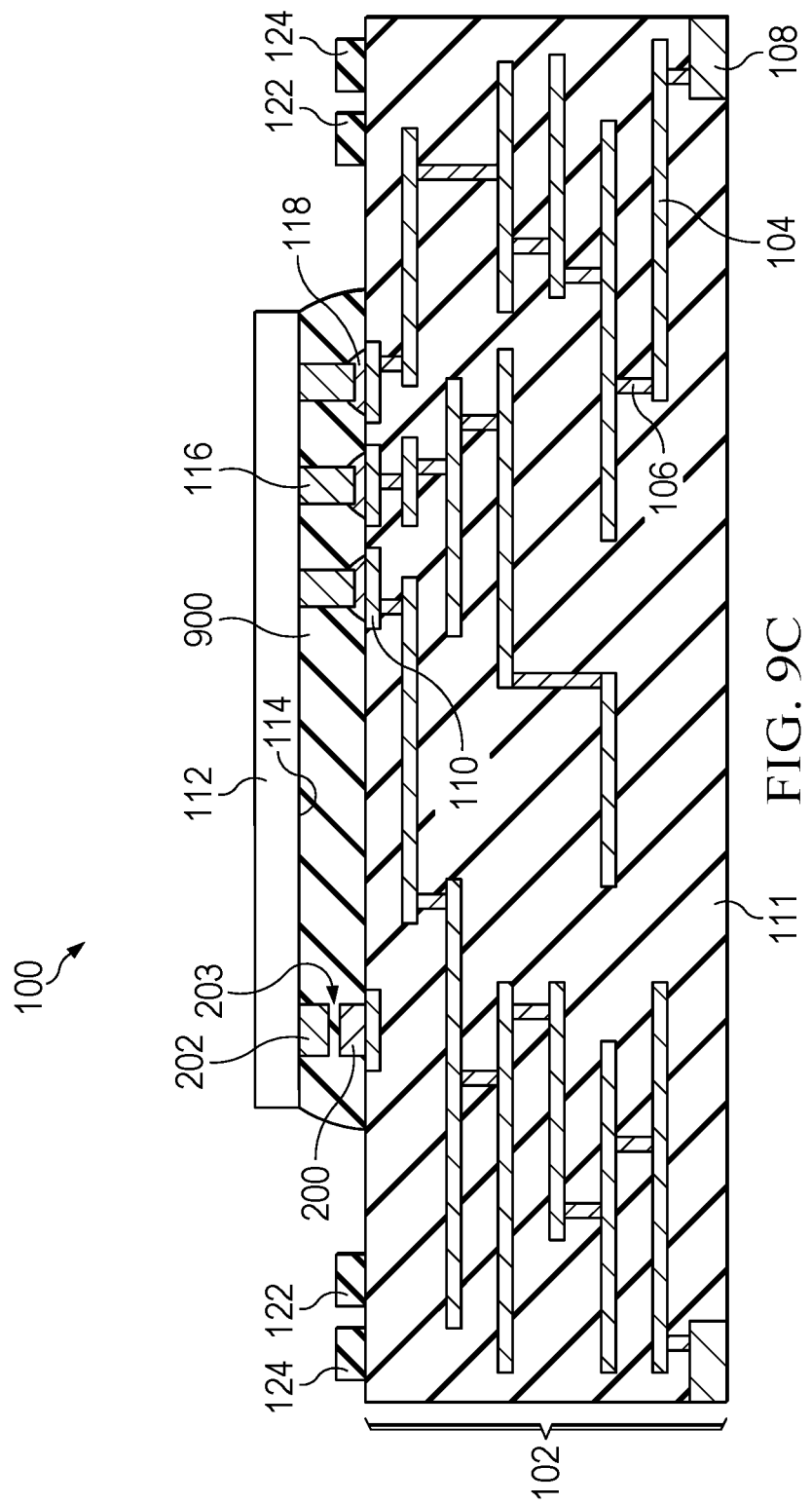

The method 800 includes underfilling a volume between the substrate and the device side with a first glob top member (806). FIG. 9C shows the application of an underfill 900 (e.g., a glob top, or epoxy matrix) in a volume between the substrate 102 and the device side 114. Application of the underfill 900 may include post chip-attach deposition along the edge of the semiconductor die 112 and filling through capillary action, or through a no-flow dispense process prior to chip attach.

Figure 9D:
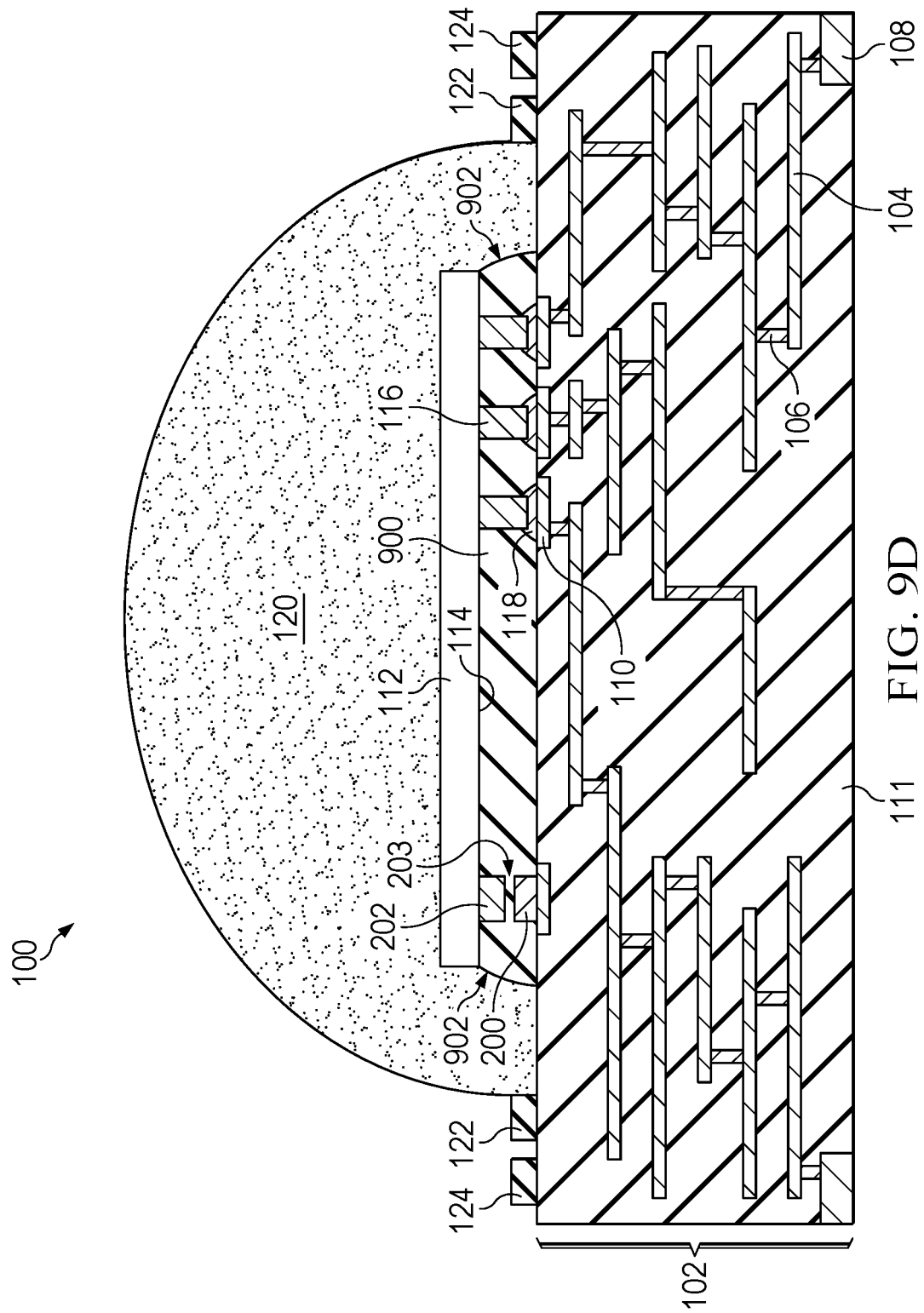

The method 800 includes covering the semiconductor die and the substrate with a second glob top member, the substrate including a ring to restrict flow of the second glob top member (808). FIG. 9D shows application of the glob top member 120 to cover the semiconductor die 112 and the substrate 102. Rings 122 and 124 restrict excessive glob top flow excursions toward the edges of the substrate 102. The application of an identical or similar material over multiple iterations may produce a boundary between the applications. Thus, application of the underfill 900 and application of the glob top member 120 may produce a boundary 902 between the applications. The boundary 902 between the underfill 900 and the glob top member 120 may have properties such as a material discontinuity across the interface, or a delamination at the interface.

Figure 9E:
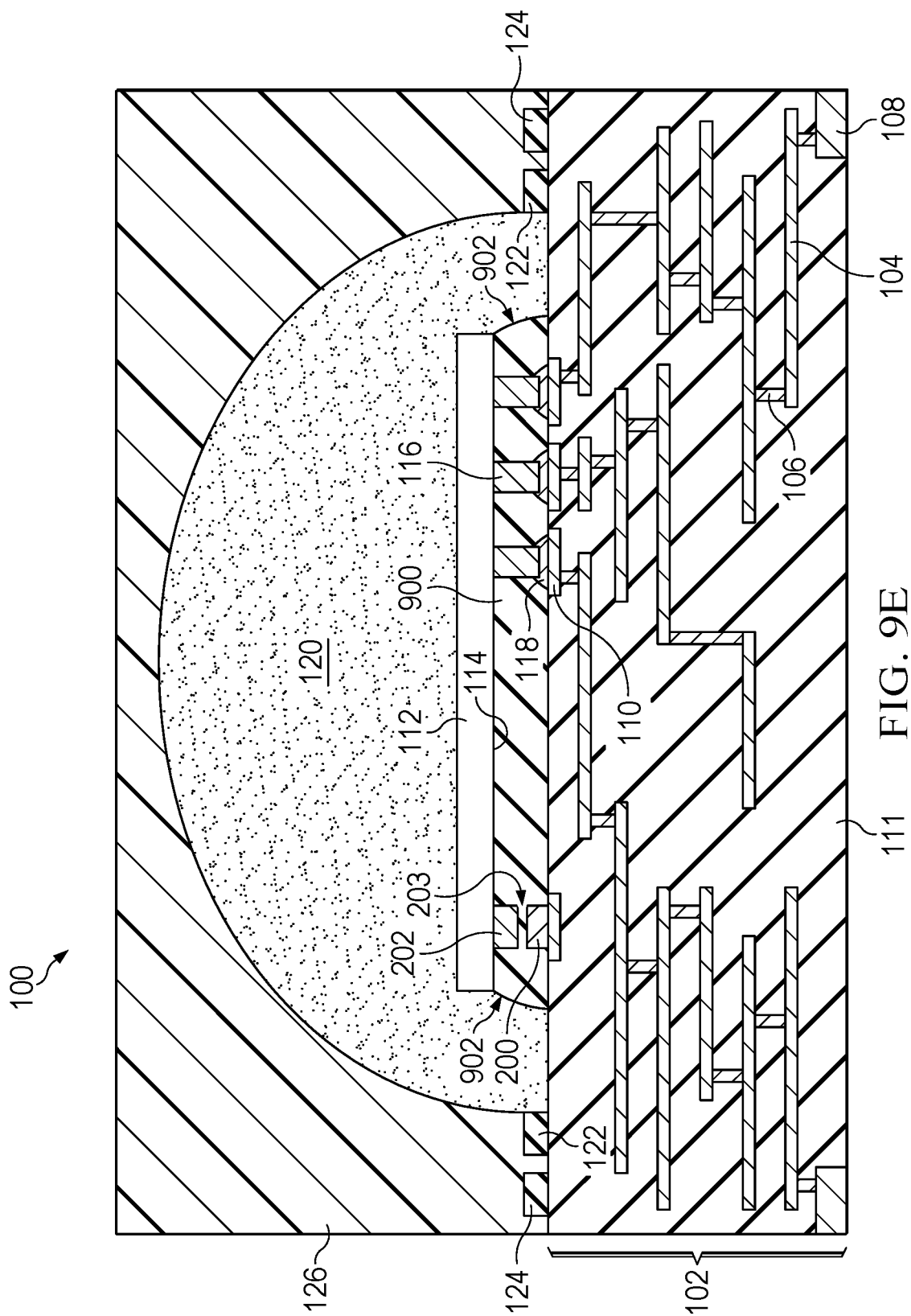

The method 800 includes covering the second glob top member and the substrate with a mold compound (810). FIG. 9E shows the mold compound 126 applied to cover the glob top member 120 and the substrate 102, as well as the rings 122, 124.

Figure 10:
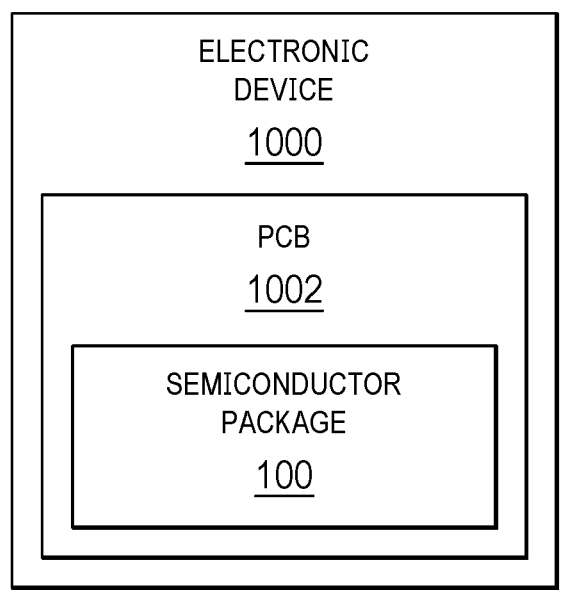
FIG. 10 is a block diagram of a semiconductor package coupled to a printed circuit board in an electronic device, in accordance with various examples.

FIG. 10 is a block diagram of a semiconductor package coupled to a printed circuit board in an electronic device, in accordance with various examples. Specifically, FIG. 10 shows an electronic device 1000, such as a smartphone, a desktop computer, a laptop computer, a notebook, a tablet, an appliance, an automobile, an aircraft, a spacecraft, etc. The electronic device 1000 includes a PCB 1002. The semiconductor package 100 is coupled to the PCB 1002. The semiconductor package 100 may be any of the example semiconductor packages 100 described herein.

In this description, the term "couple" may cover connections, communications or signal paths that enable a functional relationship consistent with this description. For example, if device A provides a signal to control device B to perform an action, then: (a) in a first example, device A is directly connected to device B; or (b) in a second example, device A is coupled to device B through intervening component C if intervening component C does not alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A semiconductor package, comprising:
   a substrate having multiple conductive layers coupled to bond pads at a surface of the substrate;
   a semiconductor die including a device side facing the substrate, the device side having first and second circuitry regions, the first circuitry region having greater sensitivity to at least one of mechanical or thermal stress than the second circuitry region;
   conductive members coupled to the bond pads of the substrate, in direct physical contact with the second circuitry region, and not in direct physical contact with the first circuitry region;
   a first support member coupled to the device side of the semiconductor die and extending toward the substrate and not touching the substrate or a second support member coupled to the substrate;
   a ring on the substrate and encircling the bond pads;
   a glob top member covering the semiconductor die and a portion of the substrate circumscribed by the ring; and
   a mold compound covering the glob top member and the substrate.

2. The semiconductor package of claim 1, further comprising an underfill between the device side of the semiconductor die and the substrate and a boundary between the glob top member and the underfill.

3. The semiconductor package of claim 1, wherein the first support member is in direct physical contact with the first circuitry region.

4. The semiconductor package of claim 1, wherein the first support member and the substrate are separated by a distance of up to 50 microns.

5. The semiconductor package of claim 1, wherein the first and second support members are separated by a distance of up to 50 microns.

6. The semiconductor package of claim 1, wherein at least one of the first and second support members are nonconductive.

7. The semiconductor package of claim 1, wherein the glob top member extends horizontally beyond the semiconductor die.

8. The semiconductor package of claim 1, wherein the substrate includes:
   first and second conductive layers, the first conductive layer positioned above the second conductive layer and coupled to the second conductive layer by way of a via; and
   a dielectric covering at least part of the first and second conductive layers and the via.

9. A semiconductor package, comprising:
   a substrate having multiple conductive layers coupled to bond pads at a surface of the substrate;
   a semiconductor die including a device side facing the substrate, the device side having first and second circuitry regions, the first circuitry region having greater sensitivity to at least one of mechanical or thermal stress than the second circuitry region and circumscribing the second circuitry region;
   conductive members coupled to the bond pads of the substrate, in direct physical contact with the second circuitry region, and not in direct physical contact with the first circuitry region;
   a first ring on the substrate and encircling the bond pads;
   a second ring on the substrate and encircling the first ring;
   a glob top member covering the semiconductor die and an area of the substrate defined by the second ring;
   a mold compound covering the glob top member and the substrate.

10. The semiconductor package of claim 9, wherein the substrate includes:
    first and second conductive layers, the first conductive layer positioned above the second conductive layer and coupled to the second conductive layer by way of a via; and
    a dielectric covering at least part of the first and second conductive layers and the via.

11. The semiconductor package of claim 9, wherein the glob top member extends horizontally beyond the semiconductor die.

12. The semiconductor package of claim 9, further comprising an underfill between the device side of the semiconductor die and the substrate and a boundary between the glob top member and the underfill.

13. The semiconductor package of claim 9, further comprising a first support member coupled to the device side of the semiconductor die and extending toward the substrate and not touching the substrate or a second member coupled to the substrate.

14. The semiconductor package of claim 13, wherein the support member is separated from the substrate by a distance of up to 50 microns.

15. The semiconductor package of claim 13, wherein the first and second support members are separated by a distance of up to 50 microns.

16. A method for manufacturing a semiconductor package, comprising:
    forming a substrate including:
       a first conductive layer;
       a second conductive layer positioned below the first conductive layer;
       a via coupled between the first and second conductive layers;
       a dielectric covering the first and second conductive layers and the via; and
       a first support member at a top surface of the substrate;
    coupling conductive members on a device side of a semiconductor die to bond pads on the substrate, the device side of the semiconductor die including first and second circuitry regions, the first circuitry region having greater sensitivity to at least one of mechanical or thermal stress than the second circuitry region, the conductive members in direct physical contact with the second circuitry region and not in direct physical contact with the first circuitry region, a second support member on the device side vertically aligned with the first support member;
    underfilling a volume between the substrate and the device side with a first glob top member;
    covering the semiconductor die and the substrate with a second glob top member, the substrate including a ring to restrict flow of the second glob top member; and
    covering the second glob top member and the substrate with a mold compound.

17. The method of claim 16, wherein the device side is coupled to a support member, the support member extending toward the substrate and not in physical contact with the substrate.

18. The method of claim 16, wherein the substrate is coupled to a support member, the support member extending toward the device side and not in physical contact with the device side.

19. The method of claim 16, wherein the device side is coupled to a first support member and the substrate is coupled to a second support member, the first and second support members extending toward each other and separated from each other by a distance of up to 50 microns.

20. The method of claim 16, wherein the substrate includes a second ring to restrict flow of a portion of the glob top member that extends beyond the first ring.

* * * * *